United States Patent
Im et al.

(10) Patent No.: US 9,076,881 B2
(45) Date of Patent: Jul. 7, 2015

(54) BUMP STRUCTURE INCLUDING NANO-WIRES AND A BODY CONNECTING ENDS OF THE NANO-WIRES, SEMICONDUCTOR PACKAGE HAVING THE BUMP STRUCTURE AND METHOD OF MANUFACTURING THE SEMICONDUCTOR PACKAGE

(71) Applicant: Samsung Electronics Co., Ltd., Suwon-si (KR)

(72) Inventors: Yun-Hyeok Im, Yongin-si (KR); Jong-Yeon Kim, Suwon-si (KR); Tae-Je Cho, Yongin-si (KR); Un-Byoung Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/171,048

(22) Filed: Feb. 3, 2014

(65) Prior Publication Data

US 2014/0147974 A1 May 29, 2014

Related U.S. Application Data

(62) Division of application No. 13/240,302, filed on Sep. 22, 2011, now Pat. No. 8,643,179.

(30) Foreign Application Priority Data

Nov. 17, 2010 (KR) .................. 10-2010-0114476

(51) Int. Cl.
 *H01L 23/00* (2006.01)
 *H01L 23/498* (2006.01)
 (Continued)

(52) U.S. Cl.
 CPC ............ *H01L 24/81* (2013.01); *H01L 23/3128* (2013.01); *H01L 23/49811* (2013.01); *H01L 24/11* (2013.01); *H01L 24/13* (2013.01);
 (Continued)

(58) Field of Classification Search
 CPC .......... H01L 2224/13147; H01L 2924/01079; H01L 2225/06513; H01L 23/49827; H01L 29/66439; H01L 33/62; H01L 2224/0401; H01L 2224/45144; H01L 2224/81193; H01L 23/49811; H01L 2924/15311; H01L 2224/1403; H01L 2224/16146; H01L 2224/73204; H01L 2225/06548; H01L 23/3128; H01L 21/02; H01L 2224/13019; H01L 2224/14181; H01L 2224/16227; H01L 2224/16235; H01L 2224/1703; H01L 2224/17505; H01L 2224/48228; H01L 2224/73253; H01L 2225/1058
 See application file for complete search history.

(56) References Cited

U.S. PATENT DOCUMENTS 5,407,992 A * 4/1995 Lee et al. .................. 427/523
6,959,856 B2 * 11/2005 Oh et al. .................. 228/245

(Continued)

FOREIGN PATENT DOCUMENTS

| JP | 2008-251963 A | 10/2006 |
|---|---|---|
| JP | 2008-210954 A | 9/2008 |
| JP | 2011238789 A | 11/2011 |

*Primary Examiner* — Evan Pert
*Assistant Examiner* — Gustavo Ramallo
(74) *Attorney, Agent, or Firm* — Sughrue Mion, PLLC

(57) ABSTRACT

Provided are a bump structure includes a first bump and a second bump, a semiconductor package including the same, and a method of manufacturing the same. The bump structure includes: first bump provided on a connection pad of a substrate, the first bump including a plurality of nano-wires extending from the connection pad and a body connecting end portions of the plurality of nano-wires; and a second bump provided on the body of the first bump.

13 Claims, 31 Drawing Sheets

(51) Int. Cl.
*H01L 25/065* (2006.01)
*H01L 23/31* (2006.01)

(52) U.S. Cl.
CPC ............ *H01L24/16* (2013.01); *H01L 25/0657* (2013.01); *H01L 2224/05572* (2013.01); *H01L 2224/06181* (2013.01); *H01L 2224/11001* (2013.01); *H01L 2224/13025* (2013.01); *H01L 2224/13075* (2013.01); *H01L 2224/13099* (2013.01); *H01L 2224/16145* (2013.01); *H01L 2224/16146* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2924/01013* (2013.01); *H01L 2924/01029* (2013.01); *H01L 2924/01047* (2013.01); *H01L 2924/01049* (2013.01); *H01L 2924/01079* (2013.01); *H01L 2924/15311* (2013.01); *H01L 2924/01005* (2013.01); *H01L 2924/01006* (2013.01); *H01L 2924/01024* (2013.01); *H01L 2924/01033* (2013.01); *H01L 2924/01074* (2013.01); *H01L 2924/014* (2013.01); *H01L 2924/0001* (2013.01); *H01L 2924/00014* (2013.01)

(56) References Cited

U.S. PATENT DOCUMENTS

| | | | | |
|---|---|---|---|---|
| 6,989,325 | B2 * | 1/2006 | Uang et al. | 438/613 |
| 7,220,310 | B2 * | 5/2007 | Wang et al. | 117/68 |
| 7,488,405 | B2 * | 2/2009 | Shigematsu et al. | 204/400 |
| 8,004,076 | B2 * | 8/2011 | Zarbock et al. | 257/690 |
| 8,350,251 | B1 * | 1/2013 | Lowgren et al. | 257/13 |
| 8,391,016 | B2 * | 3/2013 | Hwang | 361/760 |
| 2005/0006754 | A1 * | 1/2005 | Arik et al. | 257/712 |
| 2005/0048697 | A1 * | 3/2005 | Uang et al. | 438/108 |
| 2006/0254501 | A1 * | 11/2006 | Wang et al. | 117/68 |
| 2007/0148949 | A1 * | 6/2007 | Suh et al. | 438/612 |
| 2008/0083983 | A1 * | 4/2008 | Jang et al. | 257/737 |
| 2008/0185718 | A1 * | 8/2008 | Suh et al. | 257/737 |
| 2009/0065932 | A1 * | 3/2009 | Sane et al. | 257/737 |
| 2009/0072408 | A1 * | 3/2009 | Kabir et al. | 257/773 |
| 2010/0151393 | A1 * | 6/2010 | Kim et al. | 430/322 |
| 2010/0193015 | A1 * | 8/2010 | Cha et al. | 136/252 |
| 2011/0024914 | A1 * | 2/2011 | Kronholz et al. | 257/774 |
| 2011/0039459 | A1 * | 2/2011 | Yancey | 439/884 |
| 2011/0214709 | A1 * | 9/2011 | Evelsizer et al. | 136/244 |
| 2012/0070741 | A1 * | 3/2012 | Liu et al. | 429/219 |
| 2012/0119359 | A1 * | 5/2012 | Im et al. | 257/737 |
| 2012/0153454 | A1 * | 6/2012 | Liu et al. | 257/712 |

* cited by examiner

BUMP STRUCTURE INCLUDING NANO-WIRES AND A BODY CONNECTING ENDS OF THE NANO-WIRES, SEMICONDUCTOR PACKAGE HAVING THE BUMP STRUCTURE AND METHOD OF MANUFACTURING THE SEMICONDUCTOR PACKAGE

CROSS-REFERENCE TO RELATED APPLICATION

This is a divisional application of U.S. patent application Ser. No. 13/240,302, filed Sep. 22, 2011, which claims priority from Korean Patent Application No. 2010-0114476, filed on Nov. 17, 2010 in the Korean Intellectual Property Office, the entire disclosure of which is herein incorporated by reference.

BACKGROUND

1. Field

Apparatuses and methods consistent with exemplary embodiments relate to a bump structure, a semiconductor package having the bump structure and a method of manufacturing the semiconductor package. More particularly, apparatuses and methods consistent with exemplary embodiments relate to a bump structure for electrical connection between semiconductor devices, a semiconductor package having the bump structure and a method of manufacturing the semiconductor package.

2. Description of the Related Art

Generally, a semiconductor package may include a connection medium for electrically connecting a semiconductor chip and a mounting substrate. Examples of the connection medium may be a conductive wire, a conductive bump, etc. In particular, a semiconductor package having a structure where a semiconductor chip is connected by the bump is called a flip-chip package.

Recently, as the number of input/output signal lines for semiconductor chips has increased according to the miniaturization trend of electronic products using semiconductor devices, dimensions and pitches of connection pads thereof should decrease. Accordingly, a new electrical connection medium for electrical connection between semiconductor devices having connection pads with fine pitches under micrometer-scale is required.

SUMMARY

One or more exemplary embodiments provide a bump structure for electrical connection between semiconductor devices having connection pads with fine pitches under micrometer-scale.

One or more exemplary embodiments provide a semiconductor package having the above-described bump structure.

One or more exemplary embodiments provide a method of manufacturing the semiconductor package.

According to an aspect of an exemplary embodiment, there is provided a bump structure including: a first bump; and a second bump, wherein the first bump is provided on a connection pad of a substrate, the first bump includes a plurality of nano-wires extending from the connection pad and a body connecting end portions of the plurality of nano-wires, and the second bump provided on the body of the first bump.

The bump structure may further include a template having nano-sized openings on the connection pad, and the nano-wires may extend from the openings of the template, respectively.

The template may include anodized aluminum oxide (AAO).

The template may include a polymer.

The nano-wires may be integrally formed with the body.

The nano-wires may be arranged regularly on the connection pad.

The first bump may have a height of about 1 μm to about 50 μm.

Each nano-wire may have a thickness of about 10 nm to about 100 nm.

According to an aspect of an exemplary embodiment, there is provided a semiconductor package including: a semiconductor chip; a mounting substrate to mount the semiconductor chip; a first bump on a connection pad of the semiconductor chip, the first bump including a plurality of nano-wires extending from the connection pad and a body connecting end portions of the nano-wires; and a second bump on the body of the first bump, the second bump adhered to a connection pad of the mounting substrate.

The semiconductor package may further include a template having nano-sized openings on the connection pad of the semiconductor chip, the nano-wires extending from the openings of the template, respectively.

The template may include anodized aluminum oxide (AAO).

In The template may include a polymer.

The nano-wires may be integrally formed with the body.

The nano-wires may be arranged regularly on the connection pad of the semiconductor chip.

The connection pad of the semiconductor chip may be a plug that penetrates the semiconductor chip.

The semiconductor package may further include at least one semiconductor device, the at least one semiconductor device electrically connected to the semiconductor chip by the plug.

The semiconductor package may further include a redistribution plate between the mounting substrate and the semiconductor chip, and the redistribution plate may be electrically connected to at least one of the mounting substrate and the semiconductor chip by the first bump and the second bump.

According to an aspect of another exemplary embodiment, there is provided a method of manufacturing a semiconductor package, the method including: providing a first bump on a connection pad of a first substrate, the first bump including a plurality of nano-wires and a body connecting end portions of the nano-wires, and forming a second bump on the body of the first bump, the second bump adhered to a connection pad of a second substrate.

The providing the first bump may include providing a template having nano-sized openings on the connection pad of the first substrate, and filling up the openings of the template with a conductive material to form the first bump.

The providing the template may include forming an aluminum layer on the connection pad, and anodizing the aluminum layer to form the template having the openings with regular arrangement.

The providing the template may include forming a polymer layer on the connection pad, and patterning the polymer layer to form the template having the openings.

The patterning the polymer layer may include partially removing the polymer layer by light to form the nano-sized openings in the polymer layer.

The filling up the openings of the template may be performed by an electroplating process.

The electroplating process may be performed such that a conductive material is overplated to form the first bump including the nano-wires formed in the openings and the body form on the template.

The method may further include removing the template after forming the second bump.

The first substrate may be a substrate of a semiconductor chip and the second substrate may be a mounting substrate.

The first bump may be arranged on a plug that penetrates the first substrate.

The method may further include stacking at least one semiconductor device on the first substrate, and the at least one semiconductor device may be electrically connected to the first substrate.

The method may further include disposing a redistribution plate between the first substrate and the second substrate, wherein the redistribution plate may be electrically connected to at least one of the first substrate and the second substrate by the first bump and the second bump.

According to an aspect of another exemplary embodiment, there is provided a method of manufacturing a bump structure for a semiconductor package, the method including: providing a first bump for connection to a connection pad of a first substrate, the first bump including a plurality of nano-wires and a body connecting end portions of the plurality of nano-wires; and providing a second bump on the body of the first bump to be adhered to a connection pad of a second substrate.

According to an aspect of another exemplary embodiment, there is provided a bump structure of a semiconductor package, the bump structure including: a first bump having a first end connected to a connection pad of a substrate of the semiconductor package, the first bump including a plurality of nano-wires extending from the connection pad and a body connecting end portions of the plurality of nano-wires.

According to one or more example embodiments, a bump structure may include a first bump having a plurality of nano-wires and a second bump on the first bump. The bump structure may be used for electrical connection between semiconductor devices having connection pads with fine pitches under micrometer-scale.

Accordingly, the nano-wires may mechanically support the semiconductor device and increase surface areas of electrical signal paths to provide a low resistance for high frequency signals, to thereby improve mechanical and electrical reliability.

Further, since a plurality of the nano-wires is formed on one connection pad, yield rates of the semiconductor packages may be increased and shear stresses exerted on the semiconductor chip during a chip bonding process may be reduced to thereby improve process reliability.

BRIEF DESCRIPTION OF THE DRAWINGS

Exemplary embodiments will be more clearly understood from the following detailed description taken in conjunction with the accompanying drawings which represent non-limiting, exemplary embodiments as described herein.

DETAILED DESCRIPTION OF EXEMPLARY EMBODIMENTS

Figure 1:
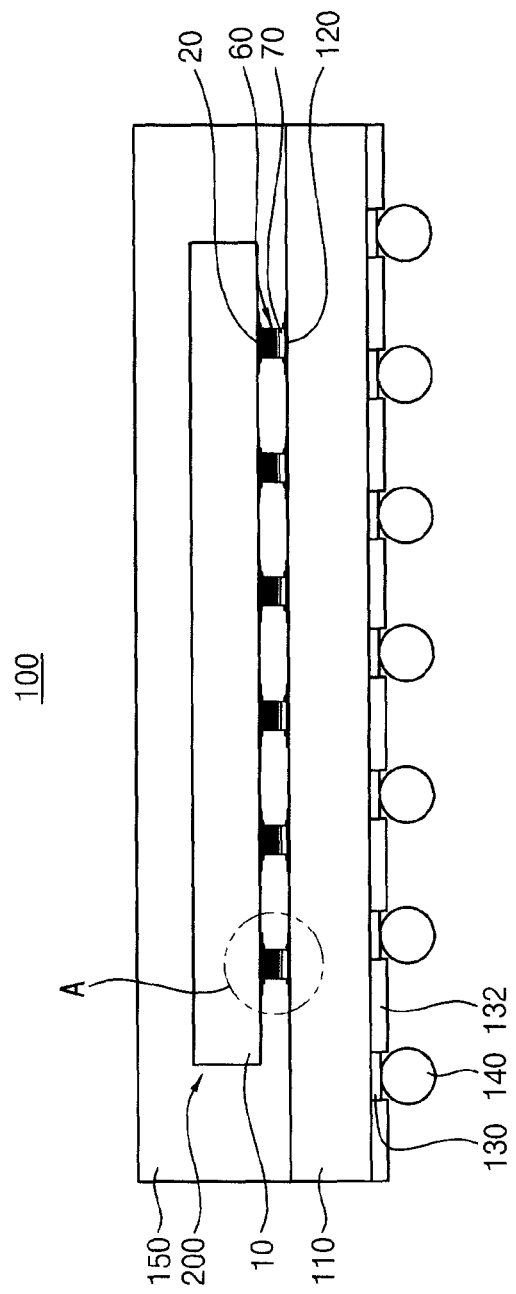
FIG. 1 is a cross-sectional view illustrating a semiconductor package in accordance with a first exemplary embodiment.

Various example embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough and complete, and will fully convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. Hereinafter, expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

First Exemplary Embodiment

Figure 2:
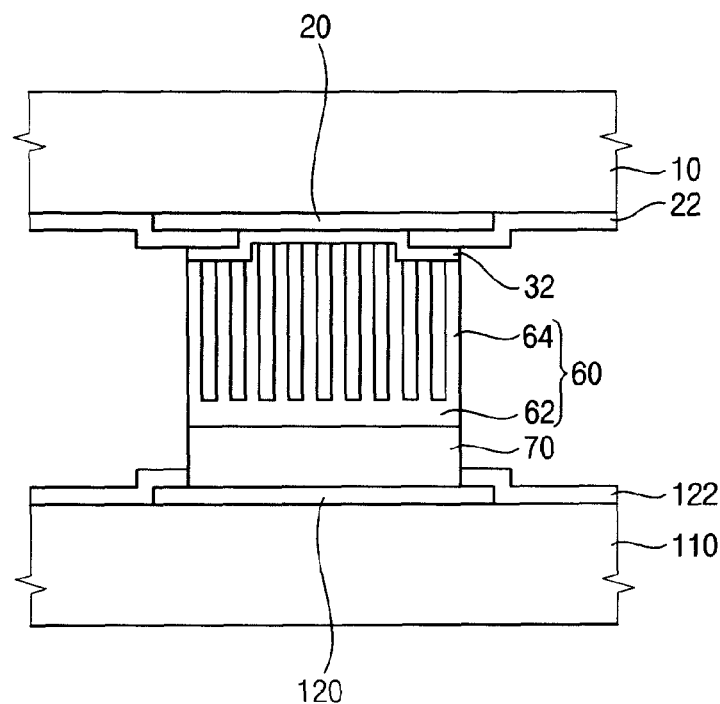
FIG. 2 is a cross-sectional view illustrating the bump structure in FIG. 1.

FIG. 1 is a cross-sectional view illustrating a semiconductor package 100 in accordance with a first exemplary embodiment. FIG. 2 is a cross-sectional view illustrating the bump structure in FIG. 1. FIG. 2 is an enlarged cross-sectional view illustrating "A" portion in FIG. 1.

Referring to FIGS. 1 and 2, a semiconductor package 100 may include a mounting substrate 110, a semiconductor chip 200 stacked on the mounting substrate 110, and a bump structure connecting the mounting substrate 110 and the semiconductor chip 200 to each other.

In the present exemplary embodiment, the mounting substrate 110 may be a substrate having an upper surface and a lower surface opposite to each other. For example, the mounting substrate 110 may be a printed circuit board (PCB). The PCB may be a multilayered circuit board having various circuits and vias therein.

Connection pads 120 may be formed on the upper surface of the mounting substrate 110. Outer connection pads 130 may be formed on the lower surface of the mounting substrate 110. The connection pad 120 may be exposed by a first insulation layer pattern 122 and the outer connection pad 130 may be exposed by a second insulation layer pattern 132.

The semiconductor chip 200 may be mounted on the mounting substrate 110. The semiconductor chip 200 may be mounted on and electrically connected to the mounting substrate 110 via a plurality of the bump structures.

The semiconductor chip 200 may include a plurality of circuit elements formed (i.e., provided) therein. The circuit element may include a plurality of memory devices. Examples of the memory devices may include a volatile memory device and a non-volatile memory device. Examples of the volatile memory device may include a DRAM, SRAM, etc. Examples of the non-volatile memory device may include an EPROM, EEPROM, Flash EEPROM, etc.

The semiconductor chip 200 may include a substrate 10 having a first surface and a second surface opposite to the first surface. A connection pad 20 may be formed on the first surface of the substrate 10. The connection pad 20 may be exposed by a third insulation layer pattern 22.

In the present exemplary embodiment, the bump structure may include a first bump 60 and a second bump 70. The first bump 60 may be arranged on the connection pad 20 of the substrate 10. The second bump 70 may be arranged on the first bump 60 and adhered to the connection pad 120 of the mounting substrate 110. Accordingly, the semiconductor chip 200 may be mounted on and electrically connected to the mounting substrate 100 by a plurality of the bump structures.

The first bump 60 may include a plurality of nano-wires 64 that extend from the connection pad 20 and a body 62 that connects end portions of the nano-wires 64. The nano-wires may extend vertically at regular intervals from the body 62. The nano-wires may be integrally formed with the body 62.

For example, the first bump 60 may include copper (Cu), nickel (Ni), gold (Au), silver (Ag), indium (In), etc. The first bump 60 may be a monolayer or a multilayer structure. The second bump 70 may include a solder such as tin (Sn), tin/silver (Sn/Ag), tin/copper (Sn/Cu), tin/indium (Sn/In). The first bump 60 may have a height of about 1 µm to about 50 µm. The nano-wire 64 may have a thickness (i.e., diameter) of about 10 nm to about 100 nm.

In the present exemplary embodiment, a seed layer pattern 32 may be formed on the connection pad 22 of the substrate 10. In this case, the nano-wire 64 may extend from the seed layer pattern 32 in a direction substantially perpendicular to the first surface the substrate 10. The end portions of the nano-wires 64 may be connected to the body 62.

A sealing member 150 may be formed on the mounting substrate 110 to protect the semiconductor chip 200 from outside. A solder ball 140 may be disposed on the outer connection pad 130 of the mounting substrate 110 and the semiconductor package 100 may be mounted on a module substrate (not illustrated) via the solder balls 140 to form a memory module.

In the present exemplary embodiment, the semiconductor chip 200 may be mounted on the mounting substrate 110 using the first bump 60 having the body 62 and the nano-wires 64 and the second bump 70 on the first bump 60.

Accordingly, the nano-wires 64 having a nano-size may be used for electrical connection between semiconductor devices having connection pads with fine pitches under micrometer-scale.

In addition, a plurality of the nano-wires 64 may mechanically support the semiconductor device and increase surface areas of electrical signal paths to provide a low resistance for high frequency signals, to thereby improve mechanical and electrical reliability.

Further, since a plurality of the nano-wires is formed on one connection pad, yield rates of the semiconductor packages may be increased and shear stresses exerted on the semiconductor chip during a chip bonding process may be reduced to thereby improve process reliability.

Figure 3:
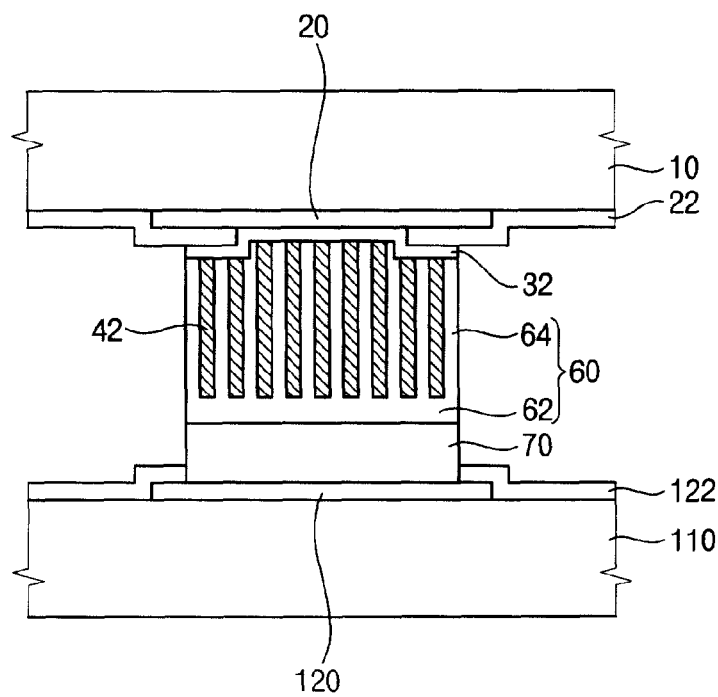
FIG. 3 is a cross-sectional view illustrating a modified example of the bump structure in FIG. 2.

FIG. 3 is a cross-sectional view illustrating a modified example of the bump structure in FIG. 2. FIG. 3 is an enlarged view illustrating "A" portion in FIG. 1.

Referring to FIG. 3, the bump structure may further include a template 42 having nano-sized openings. The nano-wires 64 of the first bump 60 may extend from the openings of the template 42. The body 62 of the first bump 60 may be formed on the template 42.

For example, the template 42 may include anodized aluminum oxide (AAO). Alternatively, the template 42 may include polymer. Example of the polymer may be polycarbonate.

Accordingly, the nano-wires 64 of the first bump 60 may be formed in the openings of the template 42 to increase mechanical strengths of the nano-wires 64, to thereby improve reliability of the bump structure.

Hereinafter, a method of manufacturing a semiconductor package in accordance with a first exemplary embodiment will be explained.

FIGS. 4 to 11 are views illustrating a method of manufacturing the semiconductor package in FIG. 1 in accordance with a first exemplary embodiment.

Figure 4:
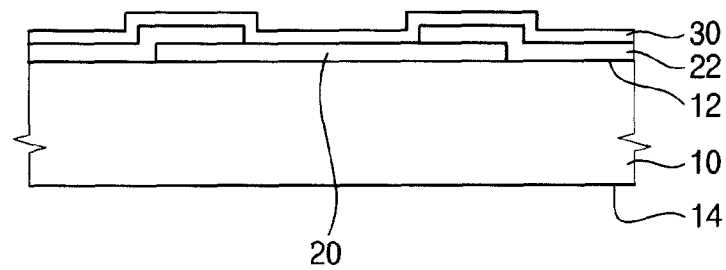
FIGS. 4 to 11 are views illustrating a method of manufacturing the semiconductor package in FIG. 1 in accordance with a first exemplary embodiment.

Referring to FIG. 4, a substrate 10 having preliminary semiconductor chips formed (i.e., provided) therein is prepared. The substrate 10 may have a first surface 12 and a second surface 14 opposite to the first surface 12.

In a first exemplary embodiment, the substrate 10 may be a silicon wafer. The wafer may include a die region and a cutting region. The preliminary semiconductor chips may be formed in the die region. The preliminary semiconductor chips may be separated by the cutting region. The cutting region may be cut by a subsequent sawing process to form a plurality of semiconductor chips.

A plurality of connection pads 20 may be formed on the first surface 12 of the substrate 10. The semiconductor chip may include a plurality of circuit elements formed therein. Input/output signals may be inputted/outputted to/from the circuit element through the connection pad 20.

Then, an insulation layer pattern 22 may be formed on the first surface 12 of the substrate 10 to expose the connection pad 20, and a seed layer 30 may be formed on the connection pad 20.

For example, the insulation layer pattern 22 may include at least one of oxide, nitride, etc. The insulation layer pattern 22 may be formed by a chemical vapor deposition (CVD) process, a plasma enhanced chemical vapor deposition (PECVD) process, an atomic layer deposition (ALD) process, a low pressure chemical vapor deposition (LPCVD) process, a sputtering process, etc. Alternatively, the insulation layer pattern 22 may be formed using polymer by a spin coating process or spray process.

The seed layer 30 may include at least one of titanium/copper (Ti/Cu), titanium/palladium (Ti/Pd), titanium/nickel (Ti/Ni), chrome/copper (Cr/Cu), etc. The seed layer 30 may be formed by a sputtering process.

Figure 5:
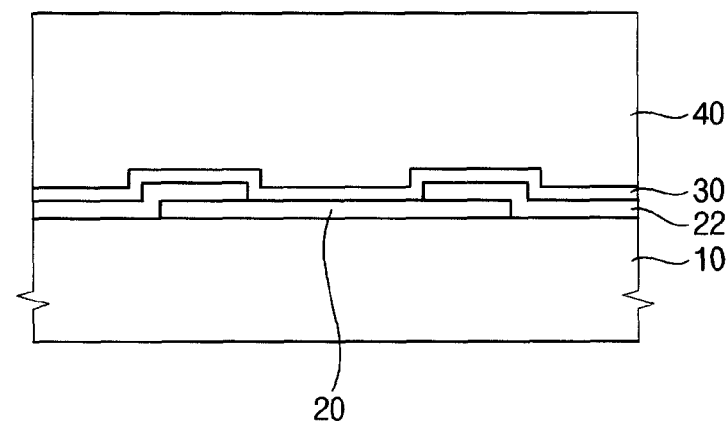
Figure 6:
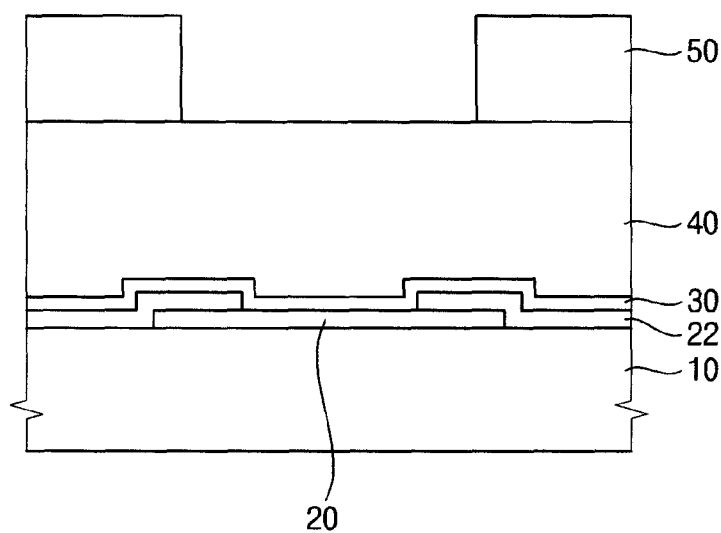

Referring to FIGS. 5 and 6, after a template forming layer 40 is formed on the seed layer 30, a mask pattern 50 is formed on the template forming layer 40 to expose a region for a bump structure to be formed.

In the present exemplary embodiment, the template forming layer 40 may be formed using an aluminum layer. The aluminum layer may be formed by a chemical vapor deposition (CVD) process, a sputtering process, etc. Alternatively, an aluminum sheet may be formed on the substrate 10 to form the template forming layer 40.

For example, the thickness of the template forming layer 40 may range from about 1 µm to about 50 µm. The thickness of the template forming layer 40 may be determined based on at least one of a height of the bump structure, a deformation and process margin thereof, a distance between a semiconductor chip and a mounting substrate.

After a photoresist layer is formed on the template forming layer 40, the photoresist layer may be patterned to form a mask pattern 50. Alternatively, after a hard mask layer is formed on the template forming layer 40, a photolithography process may be performed on the hard mask layer to form the mask pattern 50.

Alternatively, the template forming layer 40 may be formed using polymer. Example of the polymer may be polycarbonate. The polymer layer may be formed by a spine coating process or spray process.

Figure 7:
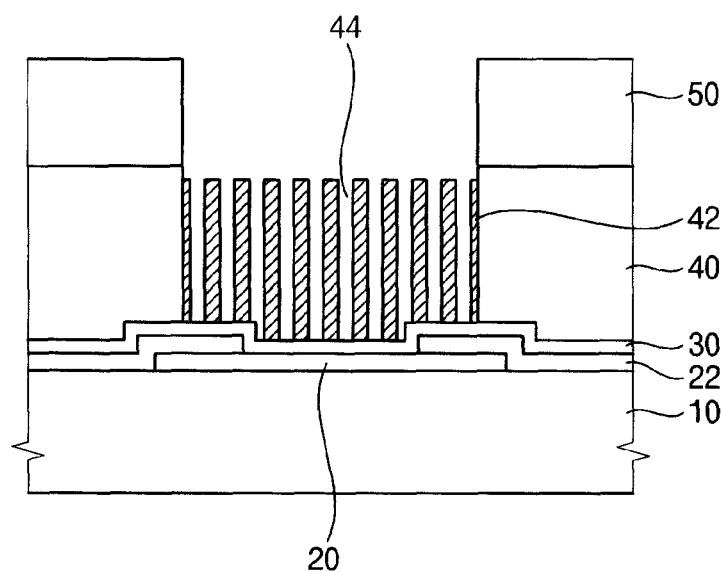
Figure 8:
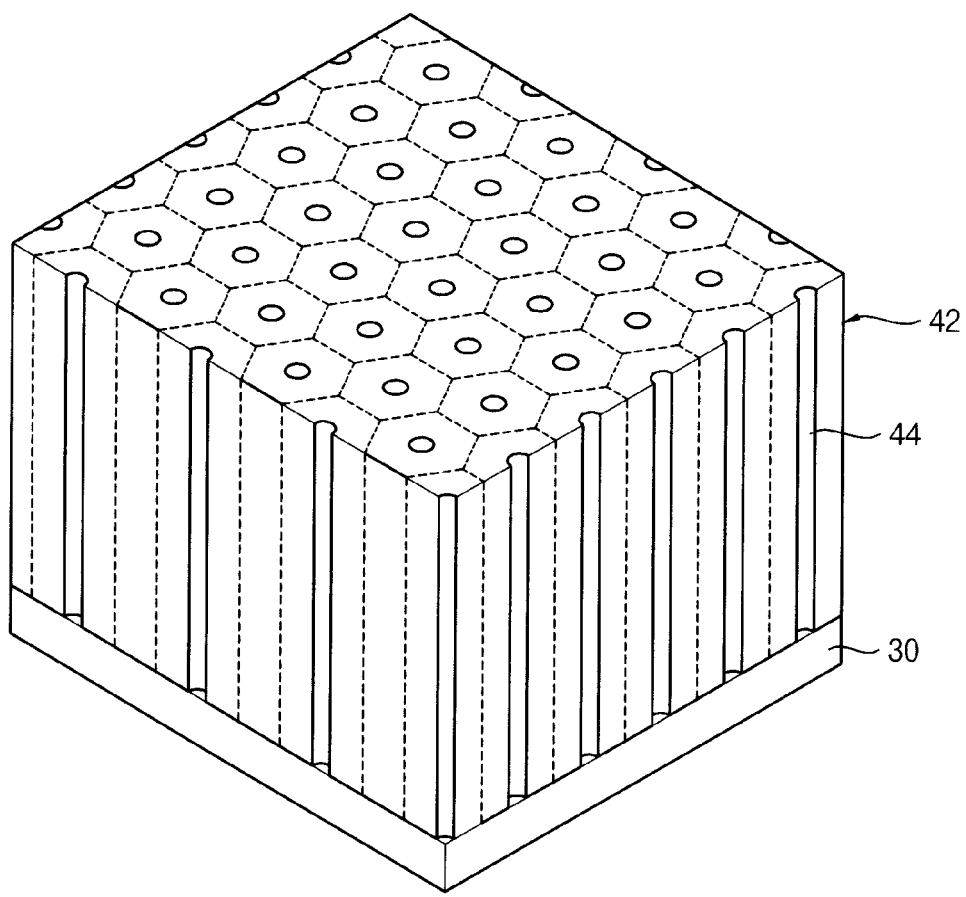

Referring to FIGS. 7 and 8, the template forming layer 40 exposed by the mask pattern 50 is patterned to form a template 42 having nano-sized openings 44.

In a first exemplary embodiment, the aluminum layer exposed by the mask pattern 50 may be oxidized to form an anodized aluminum oxide (AAO) template 42 having openings with regular arrangement.

FIG. 8 is a perspective view illustrating a portion of the AAO template. Referring to FIG. 8, after an upper portion of the aluminum layer is partially patterned, the patterned aluminum layer may be anodized to form the honeycomb-shaped AAO template 42.

The distance between the adjacent openings 44 may be tens to hundreds of nanometers. The sizes and spacing distance of the openings 44 may be selected based on anodic oxidation conditions (at least one of anodic oxidizing voltage, a kind and concentration of an acid solution, temperature, etc). For example, the opening 44 may have a diameter of about 10 nm to about 100 nm.

Accordingly, the AAO template 42 having nano-sized openings 44 may be formed on the seed layer 30. Additionally, the nano-sized openings 44 may extend vertically from the substrate 10. The seed layer 30 may be exposed by the openings 44, respectively.

Alternatively, the polymer layer exposed by the mask pattern 50 may be patterned to from the polymer template 42 having nano-sized openings 44. For example, the polycarbonate layer exposed by the mask pattern 50 may be partially removed by light such as an ion beam to form the nano-sized openings 44 in the polymer layer.

Figure 9:
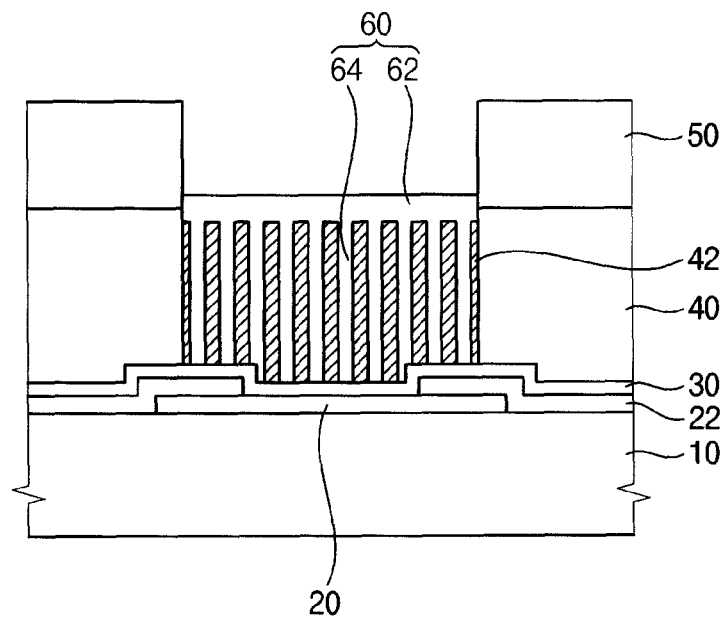

Referring to FIG. 9, the openings 44 of the template 42 is filled up with a conductive material to form a first bump 60.

In the present exemplary embodiment, the first bump 60 may be formed by an electroplating process. The seed layer 30 may be used as an electrode to form nano-sized wires 64 filling the openings 44 of the template 42.

In this case, the seed layer 30 exposed by the openings 44 of the template may be dipped in a plating solution having additives and the conductive material may be overplated such that the nano-wires 64 are formed in the openings 44 and end portions of the nano-wires 64 grow from the openings 44 of the template 42 to form a body 62. Accordingly, the first bump 60 may be formed to have the nano-wires 64 extending from the openings 44 of the template 42 and a body 62 connected to the end portions of the nano-wires 64.

For example, the first bump 60 may include at least one of copper (Cu), nickel (Ni), gold (Au), silver (Ag), indium (In), etc. The first bump 60 may be a monolayer or a multilayer structure.

The first bump 60 may have a height of about 1 μm to about 50 μm. The nano-wire 64 may have a thickness of about 10 nm to about 100 nm. When the height of the first bump 60 is greater than 50 μm, the nano-wires 64 may easily deform thereby deteriorating mechanical reliability. When the height of the first bump 60 is smaller than 1 μm, a plating process time for growing the nano-wires 64 may be deficient thereby deteriorating process reliability.

Accordingly, the height of the first bump 60 and the thickness of the nano-wire 64 may be selected in consideration of at least one of mechanical reliability and process reliability. As the height of the first bump 60 is decreased, the thickness (diameter) of the nano-wire 64 is decreased. For example, when the height of the first bump 60 is 50 μm, the maximum thickness of the nano-wire 64 may be 100 nm in consideration of the structural stability. Additionally, the height of the first bump 60 may be selected in consideration of a thickness of a stacked semiconductor chip.

Figure 10:
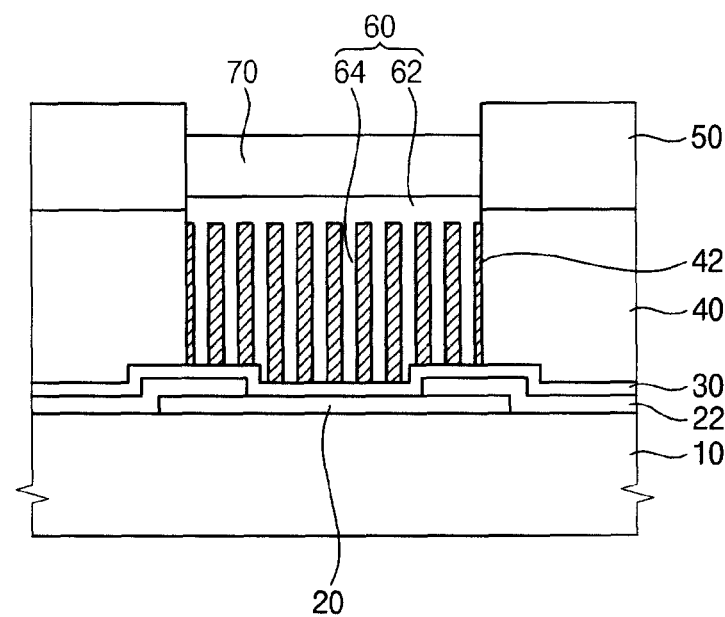
Figure 11:
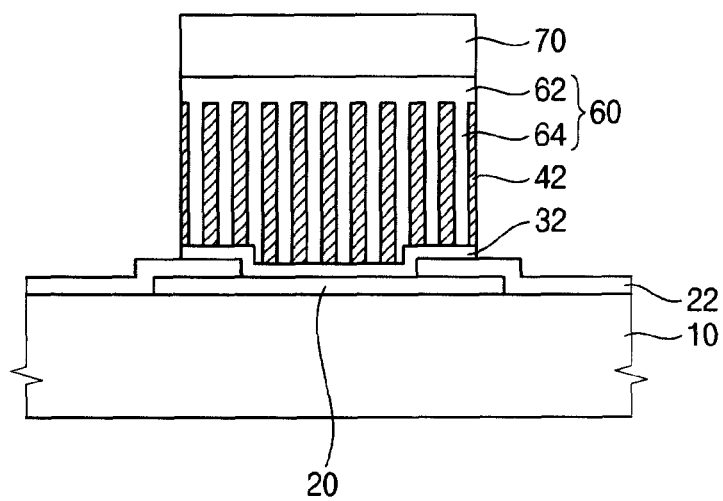

Referring to FIGS. 10 and 11, after a second bump 70 is formed on the first bump 60, the mask pattern 50 is removed. Then, the seed layer 30 is partially removed to form a seed layer pattern 32.

For example, the second bump 70 may include a solder such as tin (Sn), tin/silver (Sn/Ag), tin/copper (Sn/Cu), tin/indium (Sn/In).

In the present exemplary embodiment, after the template 42 is removed from the structure of FIG. 11, the second bump 70 may be adhered to the connection pad 120 of the mounting substrate 110 by a reflow process. For example, the template 42 may be removed by a wet etch process. The template 42 may be removed using an etching solution such as sodium hydroxide solution.

Accordingly, the bump structure having the first bump 60 and the second bump 70 in FIG. 2 may be formed between the connection pad 20 of the substrate 10 and the connection pad 120 of the mounting substrate 110.

Thus, in the present exemplary embodiment, a semiconductor chip 200 may be mounted on the mounting substrate 110 using the first bump 60 having the body 62 and the nano-wires 64 and the second bump 70 on the first bump 60.

Alternatively, the template 42 may not be removed from the structure of FIG. 11. Accordingly, the bump structure having the template 42, the first bump 60 and the second bump 70 in FIG. 3 may be formed between the connection pad 20 of the substrate 10 and the connection pad 120 of the mounting substrate 110.

Accordingly, the nano-wires 64 having a nano-size may be used for electrical connection between semiconductor devices having connection pads with fine pitches under micrometer-scale.

Referring again to FIG. 1, a sealing member 150 may be formed on the mounting substrate 110 to protect the semiconductor chip 200 from outside. Solder balls 140 may be disposed on the outer connection pads 130 of the mounting substrate 110 and the semiconductor package 100 may be mounted on a module substrate (not illustrated) via the solder balls 140 to complete a memory module (not illustrated).

FIGS. 12 to 16 are views illustrating a method of manufacturing the semiconductor package in FIG. 1 in accordance with another exemplary embodiment.

First, the processes illustrated in FIGS. 4 and 5 are performed to form the seed layer 30 and the template forming layer 40 on the seed layer 30.

Figure 12:
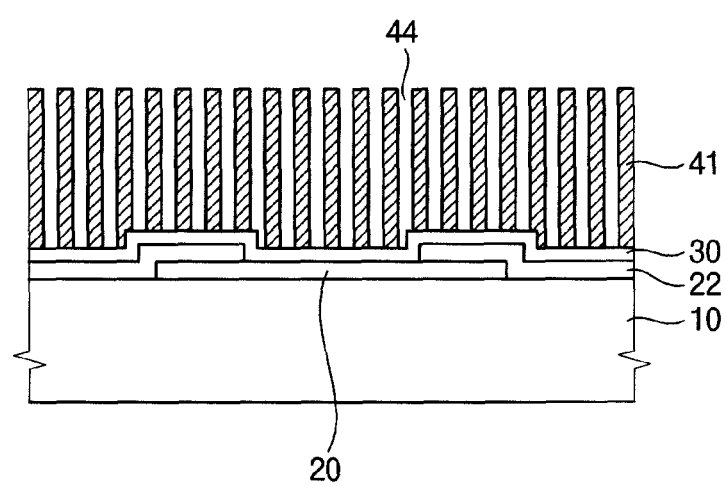
FIGS. 12 to 16 are views illustrating a method of manufacturing the semiconductor package in FIG. 1 in accordance with another exemplary embodiment.

Referring to FIG. 12, the template forming layer 40 is patterned to form a preliminary template 41 having nano-sized openings 44.

In the present exemplary embodiment, the template forming layer 40 may be formed using an aluminum layer. The aluminum layer may be oxidized to form the preliminary AAO template 41 having the openings 44 with regular arrangement.

Alternatively, the template forming layer 40 may be formed using a polymer layer such as polycarbonate layer. The polymer layer may be patterned to form the preliminary AAO template 41 having the nano-sized openings 44.

Figure 13:
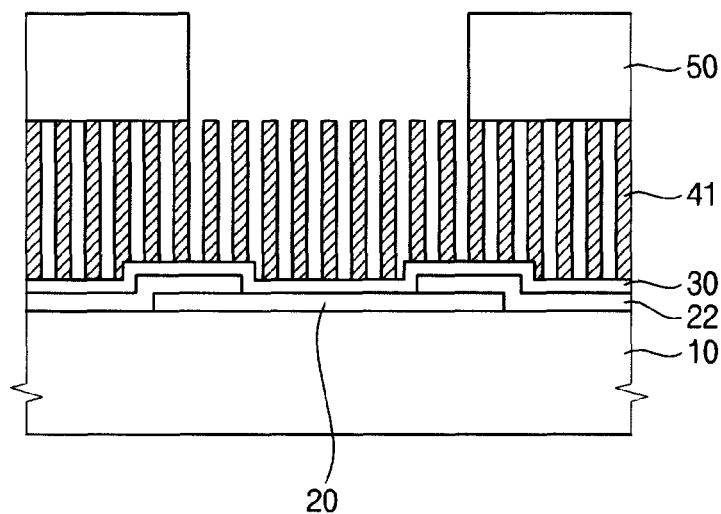
Figure 14:
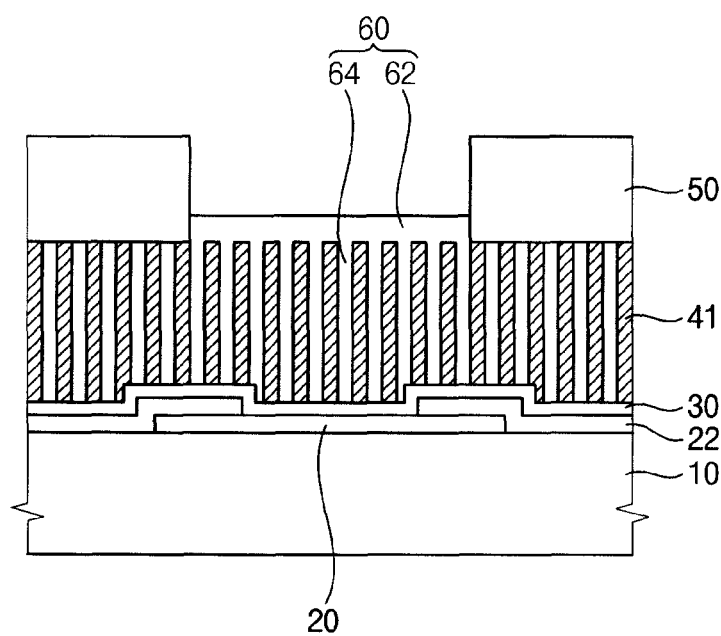

Referring to FIGS. 13 and 14, after a mask pattern 50 is formed on the preliminary template 41 to define a region for a bump structure to be formed, the openings 44 of the preliminary template 41 exposed by the mask pattern 50 are filled up with a conductive material to form a first bump 60.

The first bump 60 may be formed by an electroplating process. The conductive material may be overplated to form the first bump 60 having the nano-wires 64 extending from the openings 44 of the preliminary template 41 and a body 62 connected to end portions of the nano-wires 64.

Figure 15:
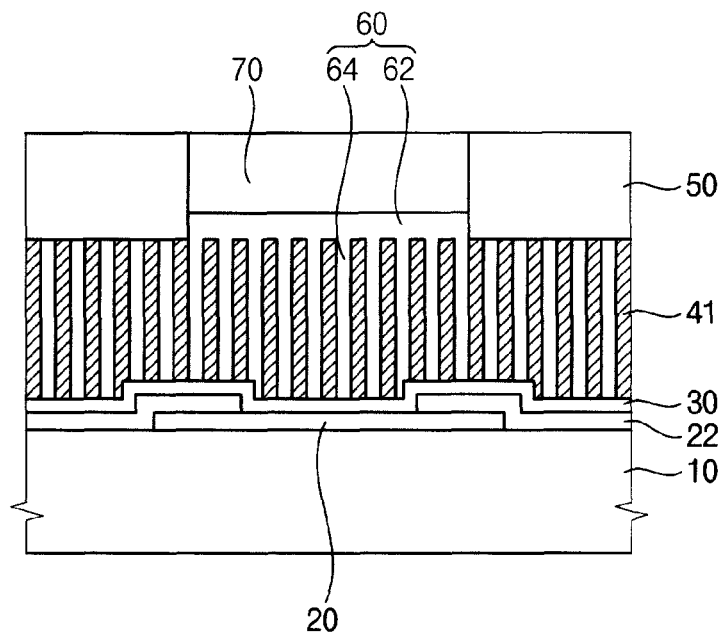
Figure 16:
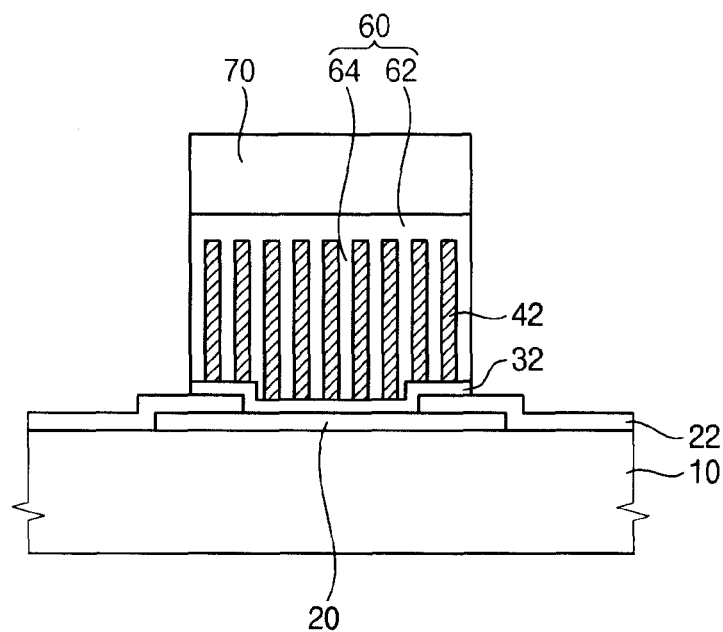

Referring to FIGS. 15 and 16, after a second bump 70 is formed on the first bump 60, the mask pattern 50 and the preliminary template 41 under the mask pattern 50 are removed to form a template 42. Then, the seed layer 30 is partially removed to form a seed layer pattern 32.

After the template 42 is removed from the structure of FIG. 16, the second bump 70 may be adhered to the connection pad 120 of the mounting substrate 110 by a reflow process. Accordingly, the bump structure having the first bump 60 and the second bump 70 in FIG. 2 may be formed between the connection pad 20 of the substrate 10 and the connection pad 120 of the mounting substrate 110.

Alternatively, the template 42 may not be removed from the structure of FIG. 16. Accordingly, the bump structure having the template 42, the first bump 60 and the second bump 70 in FIG. 3 may be formed between the connection pad 20 of the substrate 10 and the connection pad 120 of the mounting substrate 110.

Accordingly, the nano-wires 64 having a nano-size may be used for electrical connection between semiconductor devices having connection pads with fine pitches under micrometer-scale.

Second Exemplary Embodiment

Figure 17:
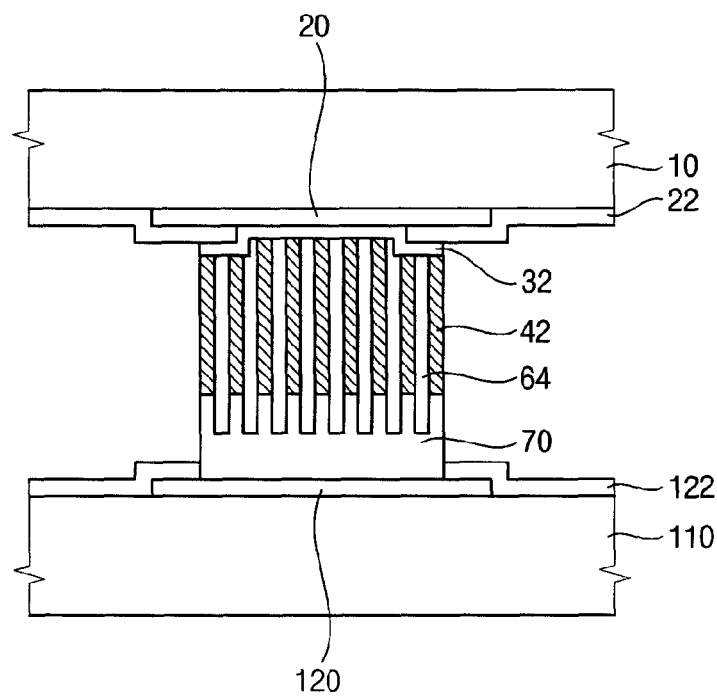
FIG. 17 is a cross-sectional view illustrating a bump structure of a semiconductor package in accordance with a second exemplary embodiment.

FIG. 17 is a cross-sectional view illustrating a bump structure of a semiconductor package in accordance with a second exemplary embodiment. FIG. 17 is an enlarged cross-sectional view illustrating "A" portion in FIG. 1. The present exemplary embodiment is substantially the same as or similar to the exemplary embodiment of FIG. 1 except for a bump structure of a semiconductor package. Thus, the same reference numerals will be used to refer to the same or like elements as those described in the exemplary embodiment of FIG. 1 and any further repetitive explanation concerning the above elements will be omitted.

Referring to FIG. 17, a bump structure according to a second exemplary embodiment may include a template 42, a first bump having nano-wires 64 and a second bump 70.

The template 42 having nano-sized openings may be arranged on a connection pad 20 of a substrate 10. The nano-wires 64 of the first bump may extrude from the openings of the template 42. The second bump 70 may be arranged on the template 42 to surround the extruding end portions of the nano-wires 64.

The template 42 may have the openings with a regular arrangement. The openings may extend vertically to the substrate 10. The nano-wires 64 of the first bump may extend from the openings of the template 42 and the end portions of the nano-wires 64 may extrude from the template 42. A portion of the second portion 70 may surround the exposed end portions of the nano-wires 64 and the other portion of the second portion 70 may be adhered to a connection pad 120 of a mounting substrate 110.

In the present exemplary embodiment, the template, the first bump having the nano-wires 64 and the second bump 70 may be used for electrical connection for a semiconductor device having connection pads with fine pitches under micrometer-scale.

Accordingly, the template 42 and the second bump 70 may increase strength of the nano-wires 64 to thereby improve reliability of the bump structure.

Figure 18:
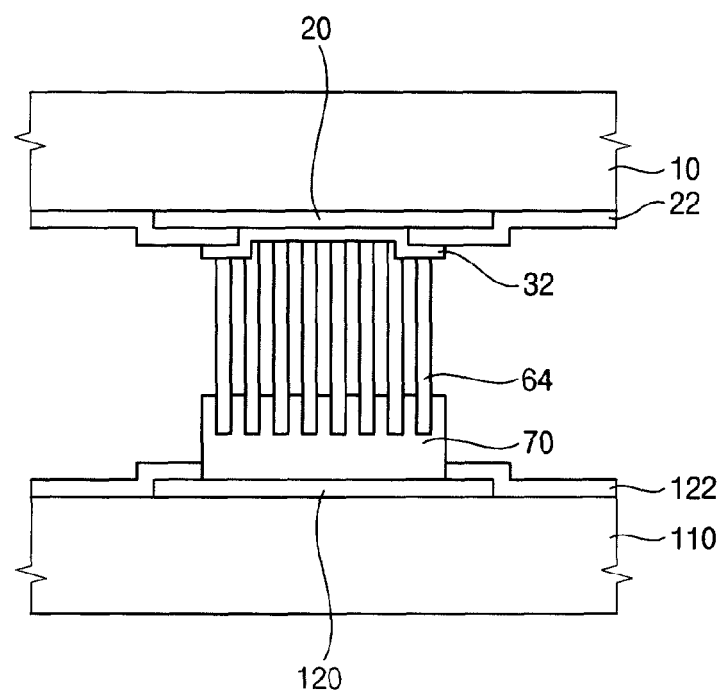
FIG. 18 is a cross-sectional view illustrating a modified example of the bump structure in FIG. 17.

FIG. 18 is a cross-sectional view illustrating a modified example of the bump structure in FIG. 17. FIG. 18 is an enlarged view illustrating "A" portion in FIG. 1.

Referring to FIG. 18, the bump structure may include a first bump having nano-wires 64 and a second bump 70.

The nano-wires 64 of the first bump may extend from a connection pad 20 of a substrate 10 in a direction substantially perpendicular to the substrate 10. The nano-wires 64 may have a regular arrangement. The second bump 70 may be arranged on the first bump to surround end portions of the nano-wires 64. A portion of the second portion 70 may surround the end portions of the nano-wires 64 and the other portion of the second portion 70 may be adhered to a connection pad 120 of a mounting substrate 110.

Accordingly, the second bump 70 may be formed to surround the end portions of the nano-wires 64 to thereby reduce shear stresses exerted on a semiconductor chip during a chip bonding process and improve mechanical strengths of the nano-wires 64.

Figure 19:
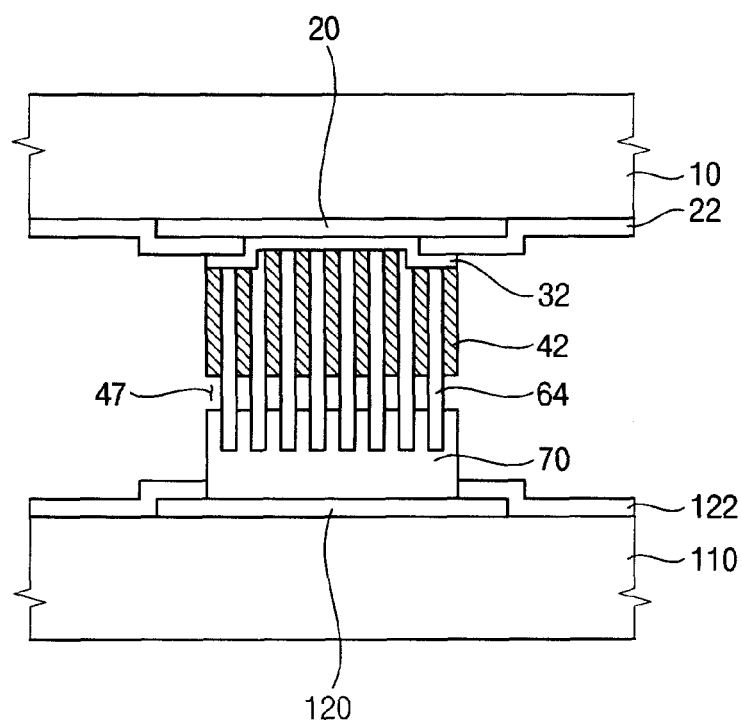
FIG. 19 is a cross-sectional view illustrating another modified example of the bump structure in FIG. 17.

FIG. 19 is a cross-sectional view illustrating another modified example of the bump structure in FIG. 17. FIG. 19 is an enlarged view illustrating "A" portion in FIG. 1.

Referring to FIG. 19, the bump structure may include a template 42, a first bump having nano-wires 64 and a second bump 70.

The template 42 may have the openings with a regular arrangement. The openings may extend vertically to the substrate 10. The nano-wires 64 of the first bump may extend from the openings of the template 42. End portions of the nano-wires 64 of the first bump may extrude from the template 42. A portion of the second portion 70 may partially surround the extruding end portions of the nano-wires 64 and the other portion of the second portion 70 may be adhered to a connection pad 120 of a mounting substrate 110.

A space 47 may be provided between the template 42 and the second bump 70. The extruding portions of the nano-wires 64 may be partially exposed between the template 42 and the second bump 70.

Accordingly, the template 42 and the second bump 70 may be formed to partially surround the end portions of the nano-wires 64 to thereby reduce shear stresses exerted on a semiconductor chip during a chip bonding process and improve mechanical strengths of the nano-wires 64.

Hereinafter, a method of manufacturing a semiconductor package in accordance with a second exemplary embodiment will be explained.

FIGS. 20 to 24 are views illustrating a method of manufacturing a semiconductor package in accordance with a second exemplary embodiment.

First, the processes illustrated in FIGS. 4 to 7 are performed to form the template 42 having nano-sized openings 44 on the connection pad 20 of the substrate 10.

Figure 20:
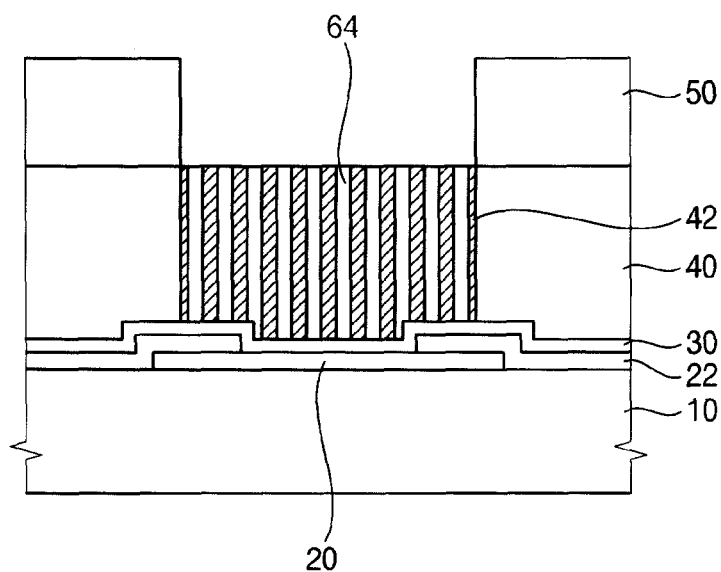
FIGS. 20 to 24 are views illustrating a method of manufacturing a semiconductor package in accordance with a second exemplary embodiment.

Referring to FIG. 20, the openings 44 of the template 42 is filled with a conductive material to form a first bump having nano-wires 64.

For example, the first bump may be formed by an electroplating process. The seed layer 30 may be used as an electrode to from the nano-wires 64 that fills the openings 44 of the template 42.

In the present exemplary embodiment, the nano-wires 64 may not protrude from the template 42. Accordingly, the height of the opening 44 may be identical or substantially identical to the height of the nano-wire 64.

Figure 21:
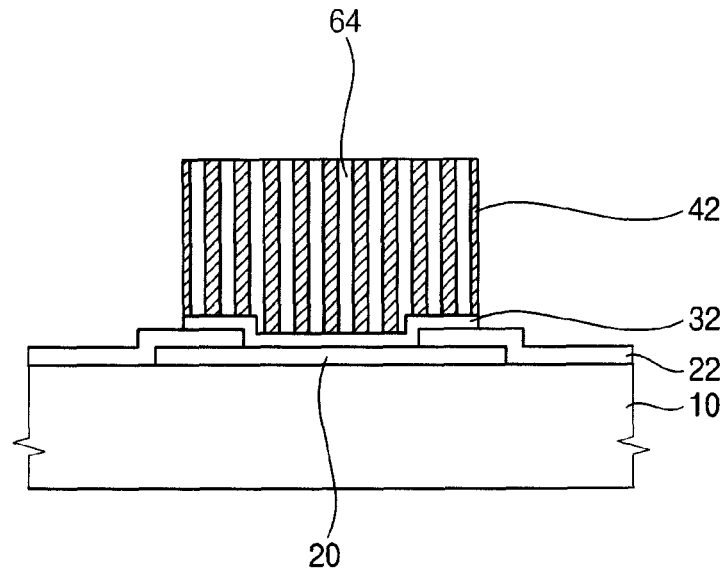
Figure 22:
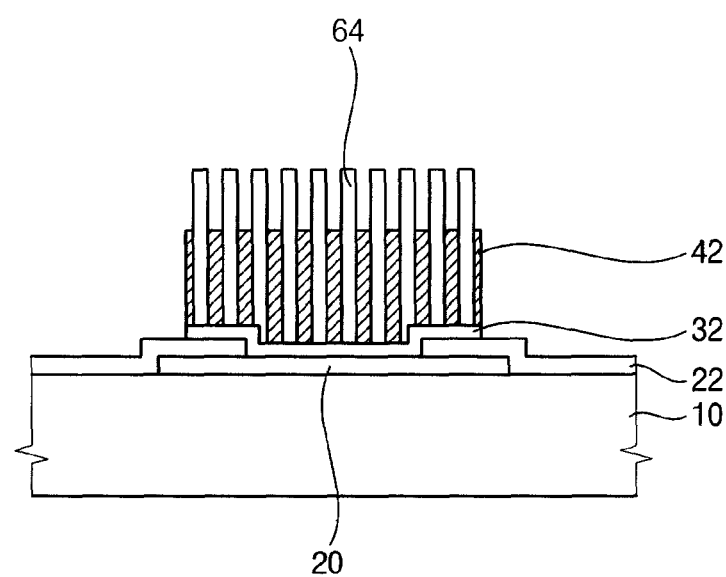
Figure 23:
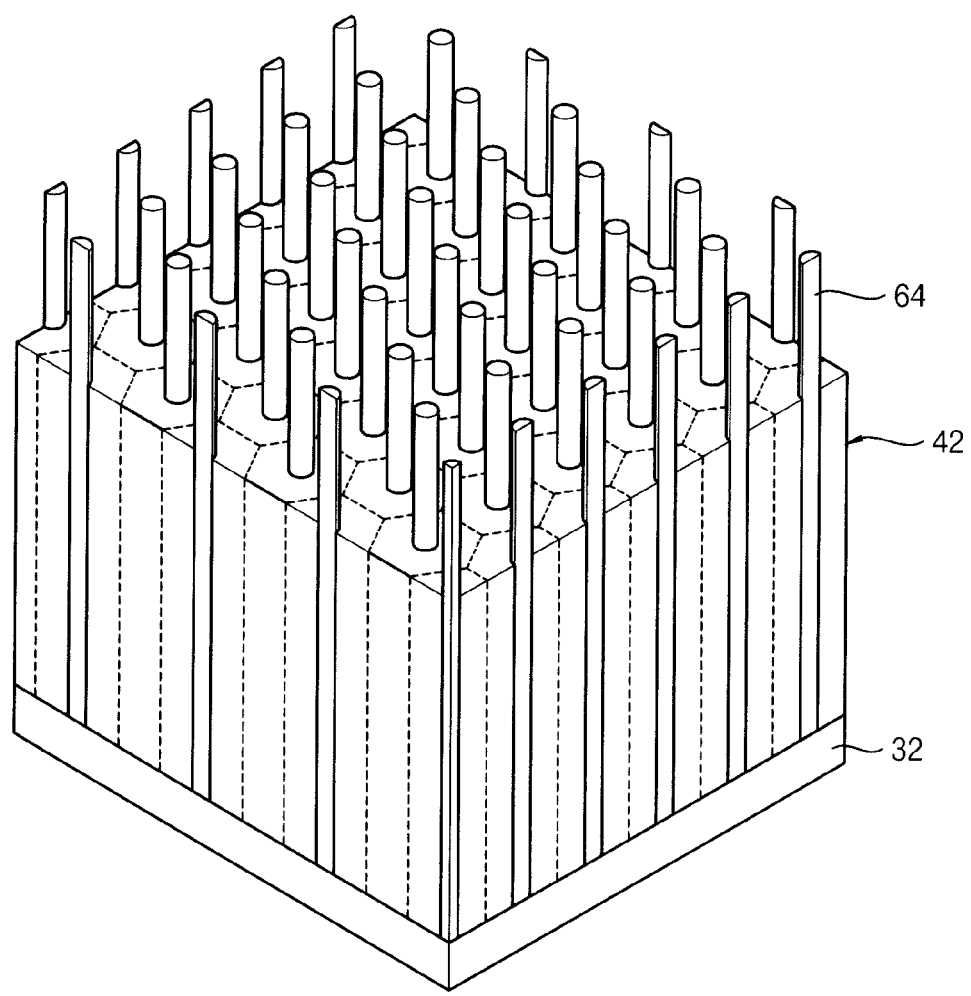

Referring to FIGS. 21, 22 and 23, after a mask pattern 50 is removed from the substrate 10, the seed layer 30 is partially etched to form a seed layer pattern 32. Then, an upper portion of the template 42 is removed to expose end portions of the nano-wires 64. For example, the upper portion of the template 42 may be removed by an etch process.

FIG. 23 is a perspective view illustrating the partially removed template. As illustrated in FIG. 23, the upper portion of the template 42 may be removed such that the end portions of the nano-wires 64 are exposed. Accordingly, the nano-wires 64 may extrude from the template 42. The length of the protruding nano-wire 64 may be controlled according to etching process conditions.

Figure 24:
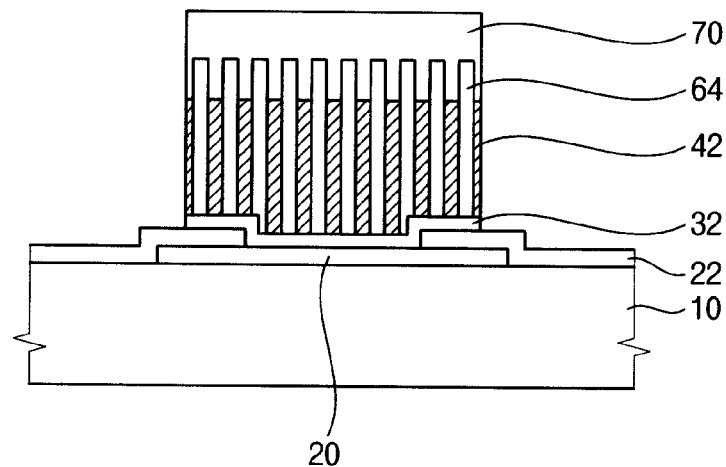

Referring to FIG. 24, a second bump 70 is formed on the first bump having the nano-wires 64.

In the present exemplary embodiment, the second bump 70 may be formed on the template 42. A portion of the second bump 70 may surround the protruding end portions of the nano-wires 64. The end portions of the nano-wires 64 may be supported by the second bump 70.

Then, another portion of the second bump 70 may be adhered to a connection pad 120 of a mounting substrate 110 by a reflow process to form the bump structure in FIG. 17. Accordingly, the semiconductor chip may be mounted on the mounting substrate 110 using the template 42, the nano-wires 64 and the second bump 70.

Figure 25:
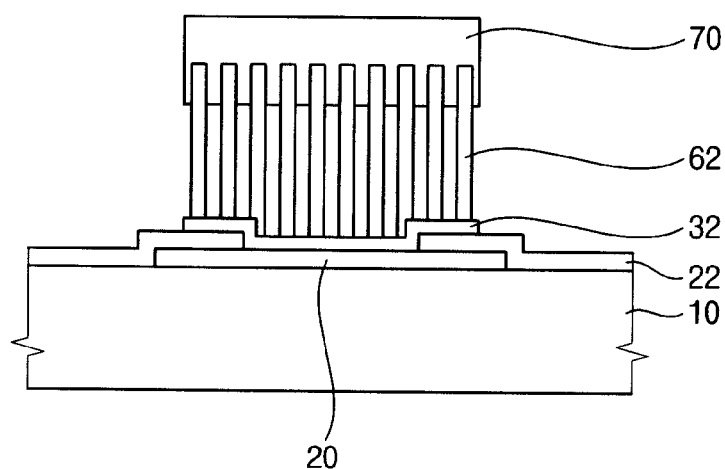
FIG. 25 is a cross-sectional view illustrating a method of forming the bump structure in FIG. 18.

FIG. 25 is a cross-sectional view illustrating a method of forming the bump structure in FIG. 18.

Referring to FIG. 25, after the template 42 is removed from the structure of the FIG. 24, the second bump 70 is adhered to the connection pad 120 of the mounting substrate 110 by a reflow process.

Accordingly, the bump structure having the nano-wires 64 and the second bump 70 in FIG. 18 may be provided between the connection pad 20 of the substrate 10 and the connection pad 120 of the mounting substrate 110.

Figure 26:
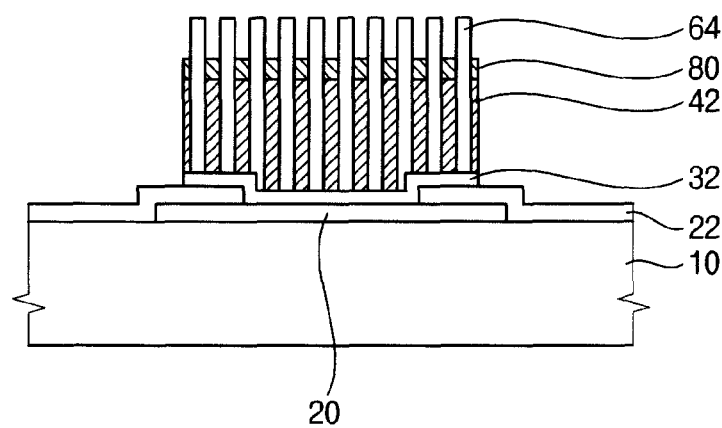
FIGS. 26 to 28 are cross-sectional views illustrating a method of forming the bump structure in FIG. 19.
Figure 27:
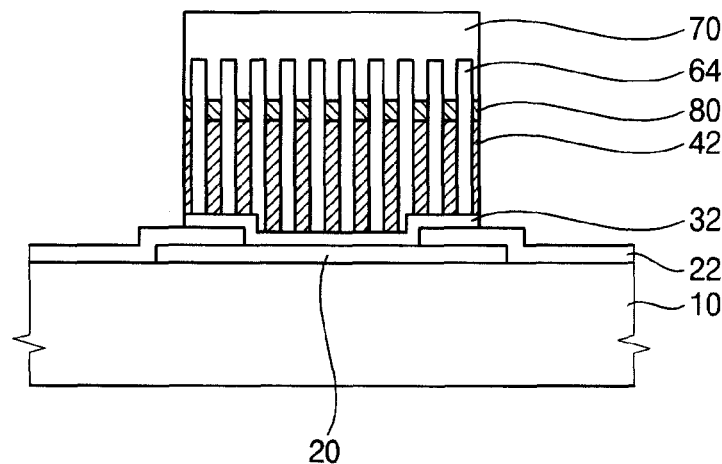
Figure 28:
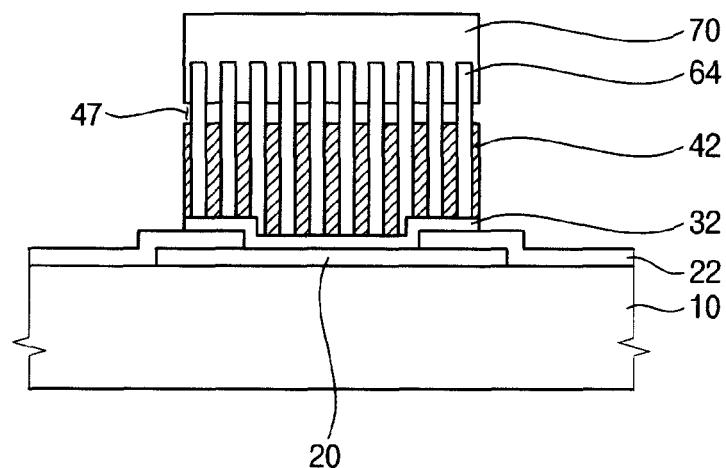

FIGS. 26 to 28 are cross-sectional views illustrating a method of forming the bump structure in FIG. 19.

First, the processes illustrated in FIGS. 20 to 22 are performed to form the nano-wires 64 protruding from the template 42.

Referring to FIG. 26, a sacrificial layer 80 is formed on the partially removed template 42. The sacrificial layer 80 may be formed on the template 42 such that the nano-wires 64 protrude from the sacrificial layer 80.

For example, the sacrificial layer 80 may be formed using an insulating material having an etch selectivity with respect to the template 42.

Referring to FIG. 27, a second bump 70 is formed on the first bump having the nano-wires 64.

The second bump 70 may be formed on the sacrificial layer 80. A portion of the second bump 70 may surround the protruding end portions of the nano-wires 64. Accordingly, the end portions of the nano-wires 64 may be supported by the second bump 70.

Referring to FIG. 28, the sacrificial layer 80 is removed from the template 42. As the template 42 is removed, a space 47 is defined between the template 42 and the second bump 70. Accordingly, the portions of the nano-wires 64 protruding from the template 42 may be partially exposed between the template 42 and the second bump 70.

For example, the sacrificial layer 80 may be removed by a wet etch process.

Then, another portion of the second bump 70 may be adhered to a connection pad 120 of a mounting substrate 110 by a reflow process to form the bump structure in FIG. 19. Accordingly, the semiconductor chip may be mounted on the mounting substrate 110 using the template 42, the nano-wires 64 and the second bump 70.

Third Exemplary Embodiment

Figure 29:
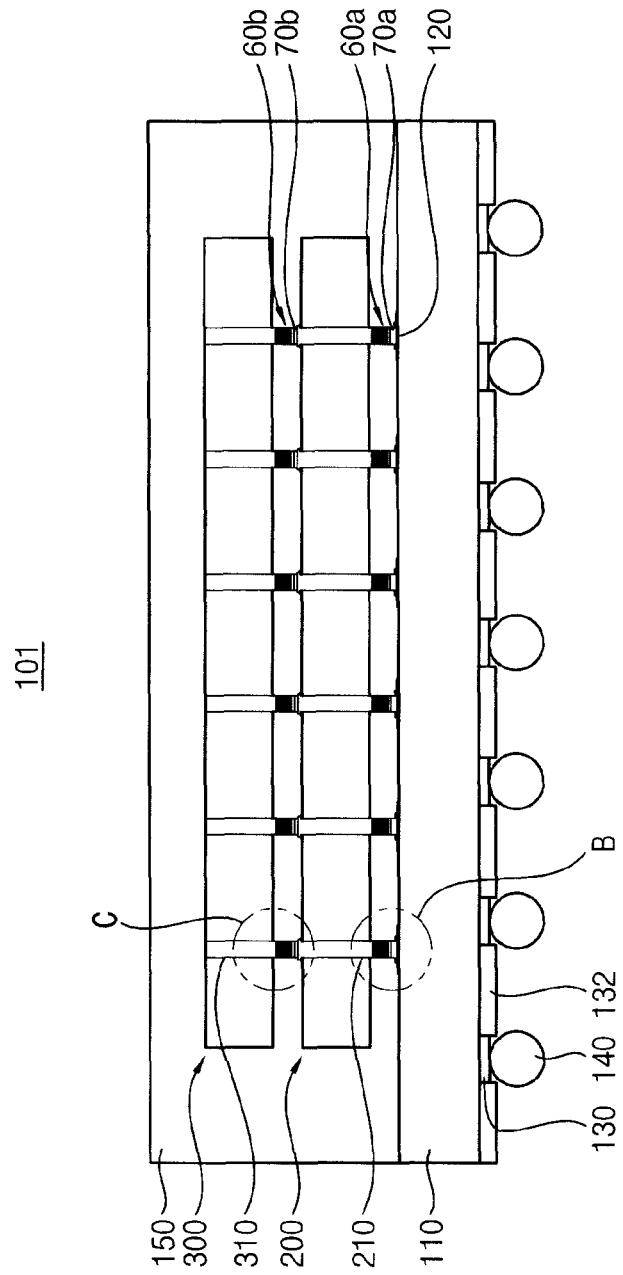
FIG. 29 is a cross-sectional view illustrating a semiconductor package in accordance with a third exemplary embodiment.
Figure 30:
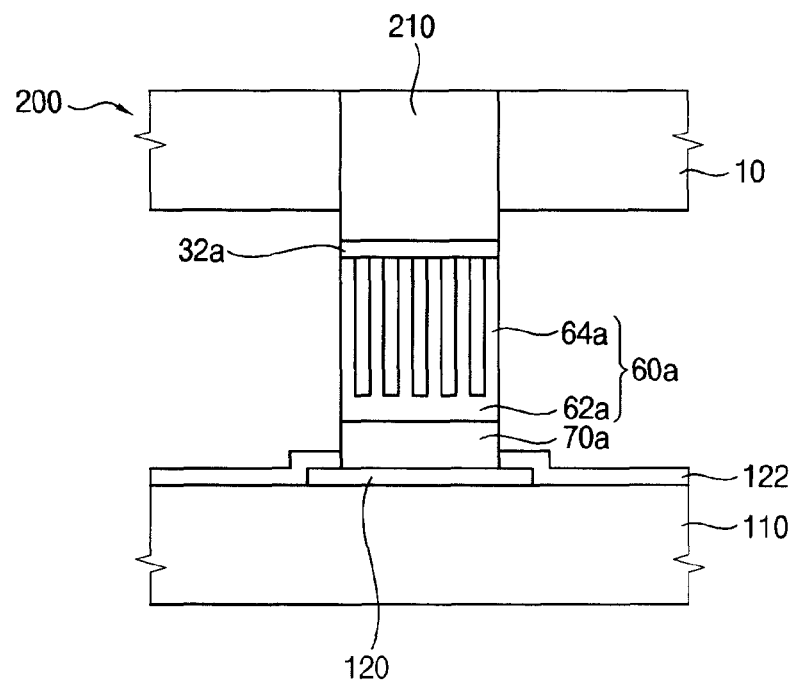
FIGS. 30 and 31 are cross-sectional views illustrating the bump structures in FIG. 29.
Figure 31:
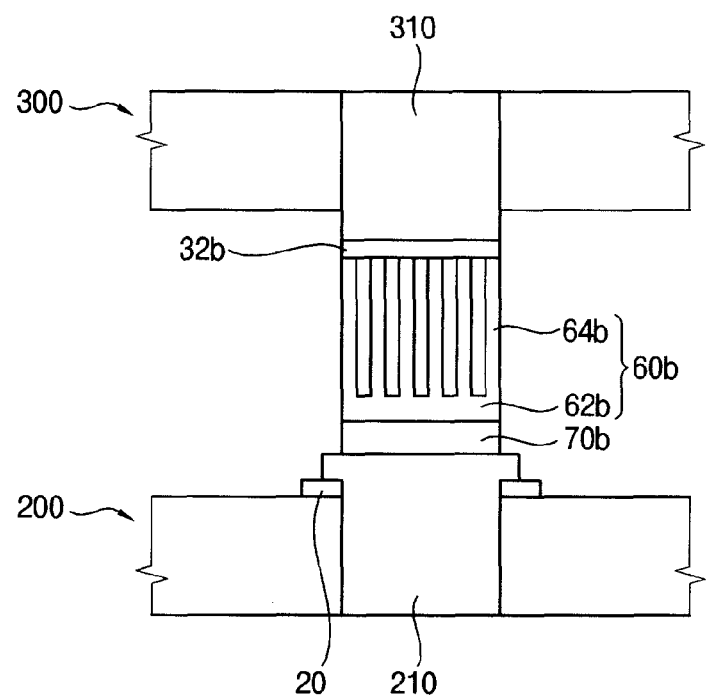

FIG. 29 is a cross-sectional view illustrating a semiconductor package in accordance with a third exemplary embodiment. FIGS. 30 and 31 are cross-sectional views illustrating the bump structures in FIG. 29. FIG. 30 is an enlarged cross-sectional view illustrating "B" portion in FIG. 29. FIG. 31 is an enlarged cross-sectional view illustrating "C" portion in FIG. 29. The present exemplary embodiment is substantially the same as or similar to the exemplary embodiment of FIG. 1 except for semiconductor chips stacked on another. Thus, the same reference numerals will be used to refer to the same or like elements as those described in the exemplary embodiment of FIG. 1 and any further repetitive explanation concerning the above elements will be omitted.

Referring to FIG. 29, a semiconductor package 101 may include a mounting substrate 110, first and second semiconductor chips 200 and 300 stacked on the mounting substrate 110, a first bump structure connecting the mounting substrate 110 and the first semiconductor chip 200, and a second bump structure connecting the first semiconductor chip 200 and the second semiconductor chip 300.

In the present exemplary embodiment, the first semiconductor chip 200 may be mounted on and electrically connected to the mounting substrate 110 via a plurality of the first bump structures. The second semiconductor chip 300 may be stacked on and electrically connected to the first semiconductor chip 200 via a plurality of the second bump structures.

The first semiconductor chip 200 may include a first plug 210 penetrating the first semiconductor chip 200. The second semiconductor chip 300 may include a second plug 310 penetrating the second semiconductor chip 300. A through electrode called through-silicon via (TSV) may be used for the first and second plugs 210 and 310.

Referring to FIG. 30, a plurality of the first bump structures may be used for electrical connection between the first semiconductor chip 200 and the mounting substrate 110. The first bump structure may be one of the above-mentioned bump structures.

The first bump structure may include a first bump 60a and a second bump 70a. The first bump 60a may be formed on the first plug 210 that penetrates the first semiconductor chip 200. The second bump 70a may be formed on the first bump 60a and may be adhered to a connection pad 120 of the mounting substrate 110.

The first bump 60a may include a plurality of nano-wires 64a and a body 62a connecting end portions of the nano-wires 64. The nano-wires 64a may extend vertically to the body 62a with regular arrangement. The nano-wires 64a may be integrally formed with the body 62a.

Referring to FIG. 31, a plurality of the second bump structures may be used for electrical connection between the second semiconductor chip 300 and the first semiconductor chip 200. The second bump structure may be one of the above-mentioned bump structures.

The second bump structure may include a first bump 60b and a second bump 70b. The first bump 60b may be formed on the second plug 310 that penetrates the second semiconductor chip 300. The second bump 70b may be formed on the first bump 60b and may be adhered to the first plug 210 that penetrates the first semiconductor chip 200.

The first plug 210 may be formed to penetrate the connection pad 20 of the first semiconductor chip 200. Alternatively, a redistribution pad (not illustrated) may be formed adjacent to the connection pad 20 and the first plug 210 may be formed to penetrate the redistribution pad.

Hereinafter, a method of manufacturing a semiconductor package in accordance with a third exemplary embodiment will be described.

Figure 32:
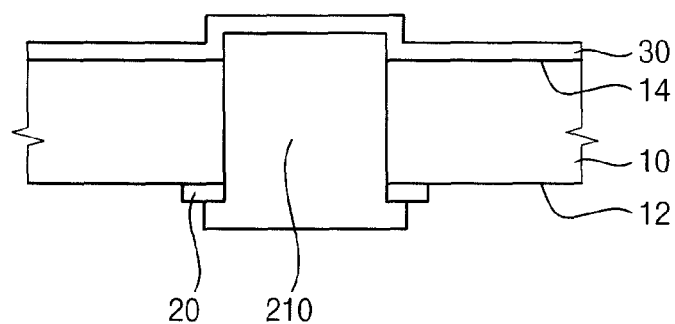
FIGS. 32 to 34 are cross-sectional views illustrating a method of manufacturing a semiconductor package in accordance with a third exemplary embodiment.
Figure 33:
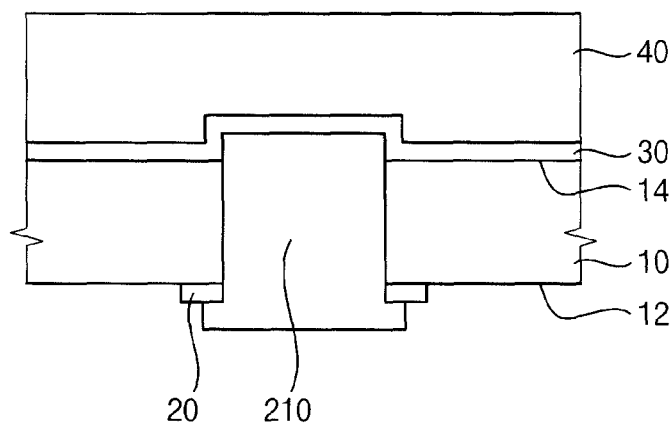
Figure 34:
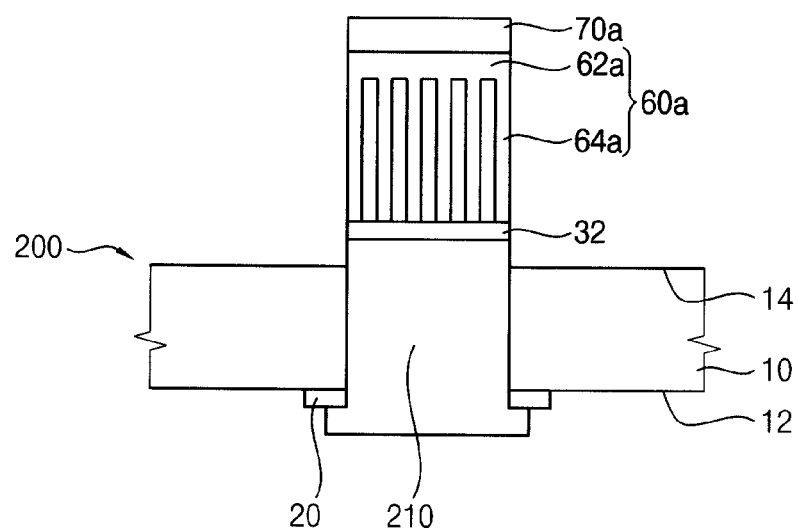

FIGS. 32 to 34 are cross-sectional views illustrating a method of manufacturing a semiconductor package in accordance with a third exemplary embodiment.

Referring to FIG. 32, a first semiconductor chip having a first plug 210 formed therein is prepared.

In the present exemplary embodiment, a substrate 10 of the first semiconductor chip may have a first surface 12 and a second surface 14 opposite to the first surface 12. Connection pads 20 may be formed on the first surface 12. The first plug 210 may be formed to penetrate the connection pad 20 and the substrate 10. Both end portions of the first plug 210 may be exposed from the first surface 12 and the second surface 14.

Then, a seed layer 30 may be formed on the second surface 14 of the substrate 10.

For example, the first surface 12 may be an active surface where the connection pads 20 and the circuit elements are formed and the second surface 14 may be a back side where the connection pads 20 are not formed. Accordingly, the seed layer 30 may be formed on the second surface 14 flatter than the first surface 12.

Referring to FIG. 33, a template forming layer 40 is formed on the seed layer 30.

An aluminum sheet for forming the template may be formed on the second surface 14 of the substrate 10. Accordingly, the aluminum sheet may be easily formed on the substrate 10 to serve as the template forming layer. The thickness of the template forming layer 40 may be determined based on a distance between the semiconductor chip and the mounting substrate, a size of the plug, etc.

Referring to FIG. 34, a first bump structure having a first bump 60a and a second bump 70a is formed on the first plug 210. The first bump structure may be formed by the processes illustrated in FIGS. 7 to 11.

Then, the second bump 70a may be adhered to the connection pad 120 of the mounting substrate 110 by a reflow process to mount the first semiconductor chip 200 on the mounting substrate 110. Similarly, a second semiconductor chip 300 may be stacked on the first semiconductor chip 200 via the second bump structures.

A sealing member 150 may be formed on the mounting substrate 110 to protect the first and second semiconductor chip 200 and 300 from outside. Solder balls 140 may be disposed on the outer connection pads 130 of the mounting substrate 110 and the semiconductor package 101 of FIG. 29 may be mounted on a module substrate (not illustrated) via the solder balls 140 to provide a memory module (not illustrated).

Fourth Exemplary Embodiment

Figure 35:
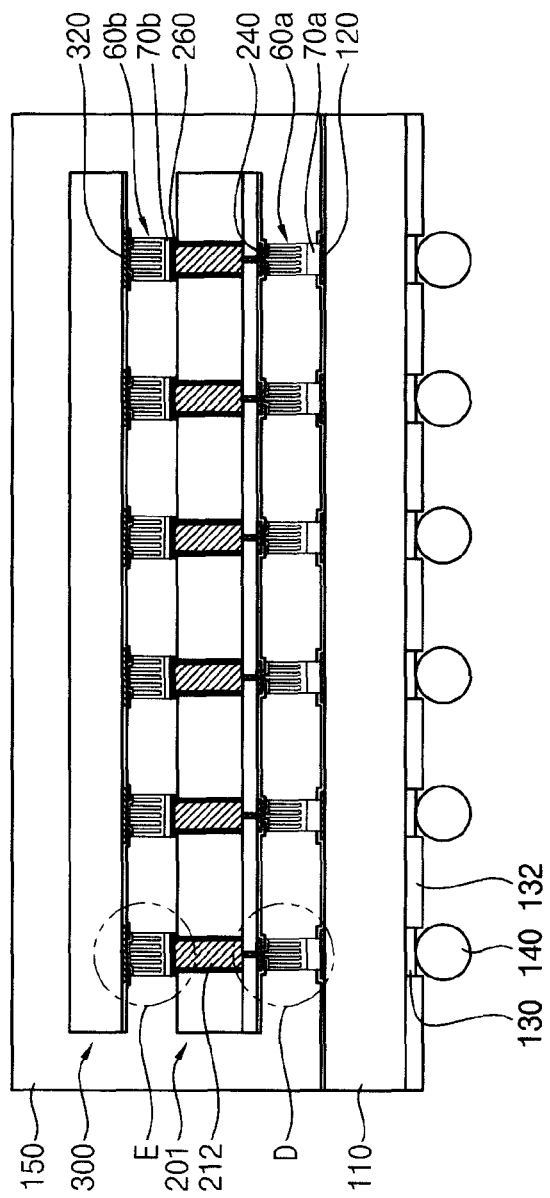
FIG. 35 is a cross-sectional view illustrating a semiconductor package in accordance with a fourth exemplary embodiment.
Figure 36:
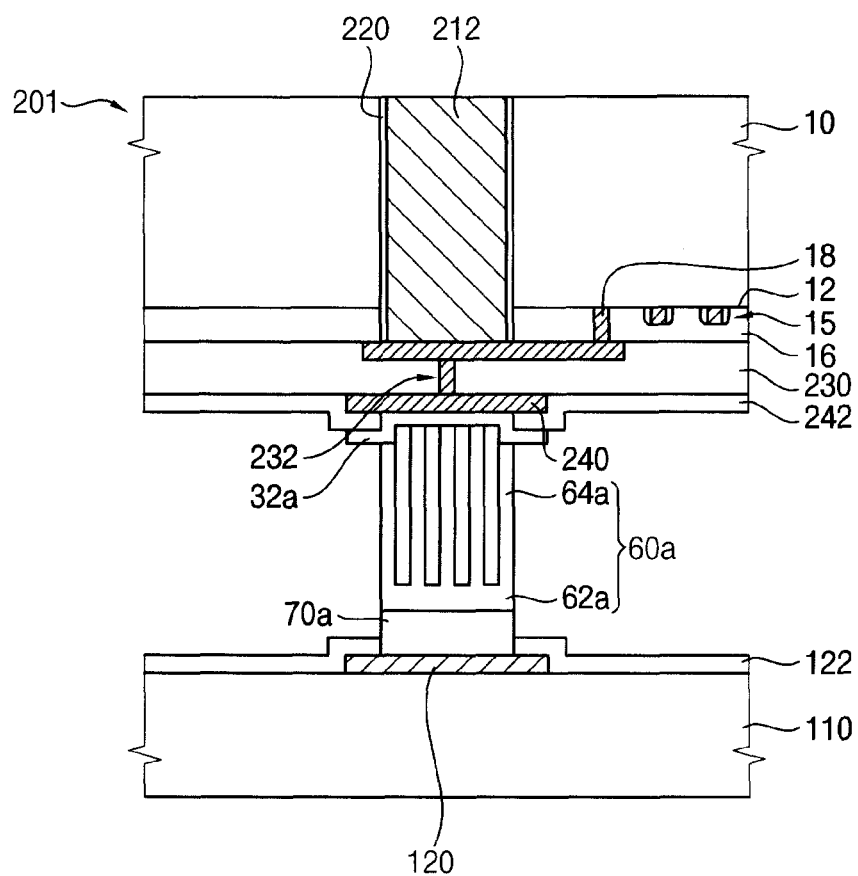
FIGS. 36 and 37 are cross-sectional views illustrating the bump structures in FIG. 35.
Figure 37:
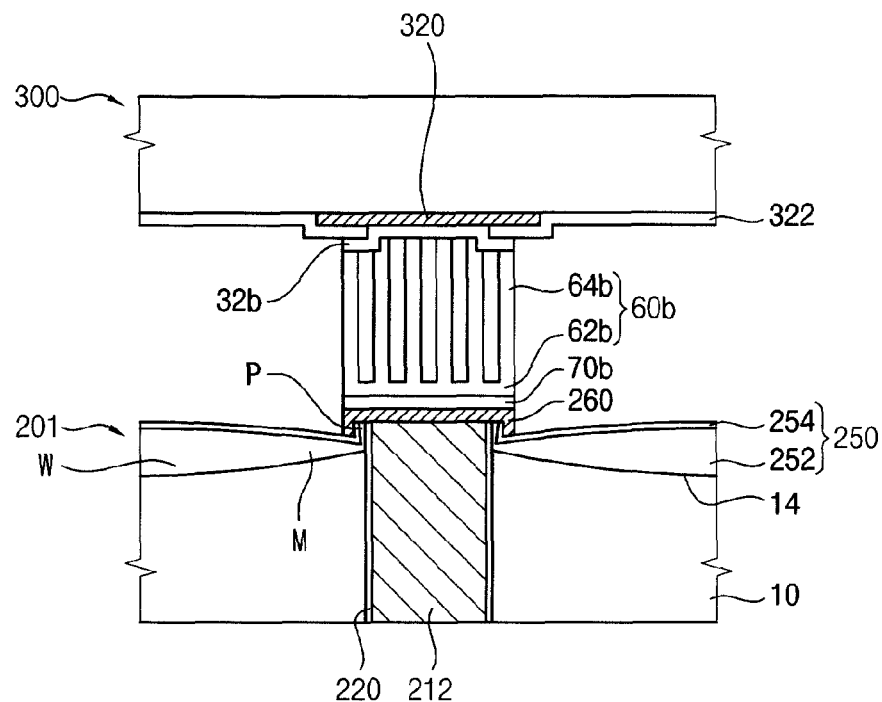

FIG. 35 is a cross-sectional view illustrating a semiconductor package in accordance with a fourth exemplary embodiment. FIGS. 36 and 37 are cross-sectional views illustrating the bump structures in FIG. 35. FIG. 36 is an enlarged cross-sectional view illustrating "D" portion in FIG. 35. FIG. 37 is an enlarged cross-sectional view illustrating "E" portion in FIG. 35. The present exemplary embodiment is substantially the same as or similar to the exemplary embodiment of FIG. 29 except for a structure and arrangement of a stacked semiconductor chip. Thus, the same reference numerals will be used to refer to the same or like elements as those described in the exemplary embodiment of FIG. 29 and any further repetitive explanation concerning the above elements will be omitted.

Referring to FIGS. 35 to 37, a semiconductor package 102 may include a mounting substrate 110, first and second semiconductor chips 201 and 300 stacked on the mounting substrate 110, a first bump structure connecting the mounting substrate 110 and the first semiconductor chip 201, and a second bump structure connecting the first semiconductor chip 201 and the second semiconductor chip 300.

The first semiconductor chip 201 may have a substrate 10 and a first plug 212 penetrating the substrate 10. The substrate 10 may have a first surface 12 and a second surface 14 opposite to the first surface 12. The first semiconductor chip 201 may be stacked on the mounting substrate 110 such that the first surface 12 of the substrate 10 faces the mounting substrate 110. The second semiconductor chip 300 may be stacked on the first semiconductor chip 201 such that the second surface 14 of the substrate 10 faces the second semiconductor chip 300.

Circuit patterns 15 may be provided on the first surface 12 of the substrate 10. For example, the substrate 10 may be a single-crystalline silicon substrate. The circuit pattern 15 may include a transistor, a diode, a capacitor, etc. The circuit patterns 15 may constitute circuit elements. Accordingly, the first semiconductor chip 201 may be a semiconductor chip including a plurality of the circuit elements formed therein.

An insulation interlayer 16 may be provided on the first surface 12 of the substrate 10 to cover the circuit patterns 15. An inter-metal dielectric layer 230 may be provided on the insulation interlayer 16. Lower wirings 18 may be provided in the insulation interlayer 16 to electrically connect the first plug 212 and the circuit patterns. Upper wirings 232 may be provided in the inter-metal dielectric layer 230 to electrically connect the first plug 212 and a connection pad 240. The connection pad 240 may be exposed by an insulation layer pattern 242. Accordingly, the first semiconductor chip 201 may have a via middle structure where the first plug, that is, the through electrode, is formed after the circuit elements are formed.

An insulation layer 220 may be provided between the first plug 212 and the substrate 10 to insulate the substrate 10 and the first plug 212 from each other. An insulation layer pattern 250 may be formed on the second surface 14 of the substrate 10 to expose an end portion of the first plug 212. A connection pad 260 may be provided on the end portion of the first plug 212 exposed from the second surface 14 of the substrate 10. For example, the connection pad 260 may include a metal such as copper.

The insulation layer pattern 250 may include a first insulation layer 252 and a second insulation layer 254. For example, the first insulation layer 252 may include a silicon oxide layer having stress properties relatively similar to the silicon substrate. The second insulation layer 254 may include a silicon nitride or a silicon oxynitride layer having stress properties relatively different from the silicon substrate. Accordingly, the first insulation layer 252 may be interposed between the substrate 10 and the second insulation layer 254 to serve as a stress buffer capable of reducing a mechanical stress. The thickness of the first insulation layer 252 may be determined in consideration of thermal expansion coefficient and stress properties of the substrate 10 and the first insulation layer 252. For example, the first insulation layer 252 may have a thickness of from about 1.5 μm to about 2.5 μm.

The insulation layer 252 may include a peripheral region (P) adjacent to the first plug 212 exposed from the second surface 14, a substrate region (W) between adjacent first plugs and a connection region (M) between the peripheral region and the substrate region. The peripheral region (P) may extrude from the connection region (M) and the substrate region (W). The peripheral region (P) may have an upper surface higher than those of the connection region (M) and the substrate region (W).

The substrate region (W) may be a region between a plurality of the first plugs 212. For example, the substrate region (W) may be a portion of the insulation layer pattern 250 that is formed on a middle region of the substrate 10 interposed between the first plugs 212. The connection region (M) may be a region extending from the peripheral region (P) to the substrate region (W). The connection region (M) may be provided between the peripheral region (P) and the substrate region (W) to have an upper surface lower than that of the peripheral region (P).

The connection pad 260 may be formed to cover the upper surface of the first plug 212 and at least a portion of the peripheral region (P). Accordingly, the peripheral region (P) of the first insulation layer 252 may be formed to extrude from the connection region (M) and the connection region (M) may be formed to have the upper surface lower than that of the substrate region (W). Thus, the contact area between the connection pad 260 and the first insulation layer 252 may be increased three-dimensionally, to thereby improve contact reliability. Additionally, as the height of the connection pad 260 is decreased, the thickness of the semiconductor chip may be reduced.

A plurality of the first bump structures may be used for electrical connection between the first semiconductor chip 201 and the mounting substrate 110. The first bump structure may be one of the above-mentioned bump structures.

The first bump structure may include a first bump 60a and a second bump 70a. The first bump 60a may be formed on the connection pad 240 of the first semiconductor chip 201. The second bump 70a may be formed on the first bump 60a and may be adhered to a connection pad 120 of the mounting substrate 110.

The first bump 60a may include a plurality of nano-wires 64a and a body 62a connecting end portions of the nano-wires 64. The nano-wires 64a may extend vertically to the body 62a with a regular arrangement. The nano-wires 64a may be integrally formed with the body 62a.

A plurality of the second bump structures may be used for electrical connection between the second semiconductor chip 300 and the first semiconductor chip 201. The second bump structure may be one of the above-mentioned bump structures.

The second bump structure may include a first bump 60b and a second bump 70b. The first bump 60b may be formed on a connection pad 320 of the second semiconductor chip 300. The second bump 70b may be formed on the first bump 60b and may be adhered to the connection pad 260 on the first plug 210 that penetrates the first semiconductor chip 201.

Alternatively, the second bump 70b may be omitted and the first bump 60b may directly contact with the connection pad 260 of the first plug 212. When the first bump 60b and the connection pad 260 include copper, the first bump 60b and the connection pad 260 on the first plug 210 may be adhered to each other by a copper-copper (Cu—Cu) bonding process.

Hereinafter, a method of manufacturing a semiconductor package in accordance with a fourth exemplary embodiment will be explained.

Referring to FIGS. 36 and 37, after a wafer process (FEOL process) is performed to form circuit patterns 15 on a substrate 10, the first plug 212 may be formed to penetrate the substrate 10. Then, a wiring process (BEOL process) may be performed to form upper wirings 232 that are electrically connected to the first plug 212.

Then, a back side of the substrate 10 may be partially removed to expose a portion of the first plug 212, and a connection pad 260 may be formed on the exposed first plug 212. In particular, the substrate 10 may be partially removed to form a second surface 14 having a concave surface between the adjacent plugs, and then, an insulation layer pattern 250 may be formed to have a first insulation layer 252 that exposes an upper surface of the first plug 212 and a second insulation layer 254. A connection pad 26 may be formed to cover the upper surface of the first plug 212 and at least a portion of a peripheral region (P) of the first insulation layer 252. Thus, the first semiconductor chip 201 having a via middle structure may be formed.

Then, processes similar to those illustrated in FIGS. 4 to 11 may be performed to form the first bump structure and the second bump structure, and then, the first semiconductor chip 201 and the second semiconductor chip 300 may be stacked on the mounting substrate 110.

Figure 38:
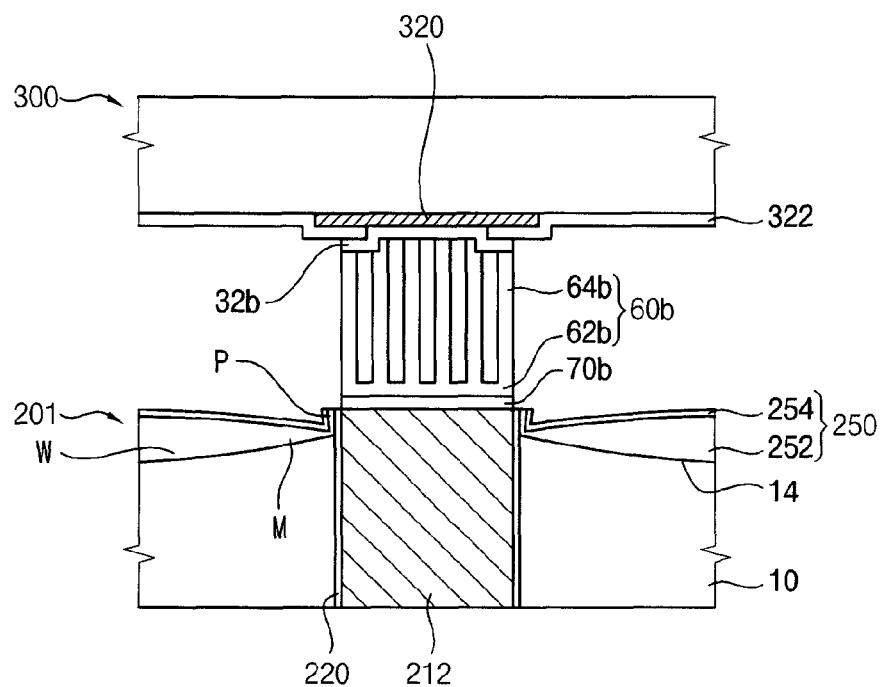
FIG. 38 is a cross-sectional view illustrating a modified example of the bump structure in FIG. 37.

FIG. 38 is a cross-sectional view illustrating a modified example of the bump structure in FIG. 37. FIG. 38 is an enlarged cross-sectional view illustrating "E" portion in FIG. 35.

Referring to FIG. 38, the second bump 70b may be directly connected to the first plug 212.

Accordingly, the first bump 60b may be formed on the connection pad 320 of the second semiconductor chip 300, the second bump 70b may be formed on the first bump 60b, and the second bump 70b may be adhered directly to the first plug 212 that penetrates the substrate 10 of the first semiconductor chip 201.

Fifth Exemplary Embodiment

Figure 39:
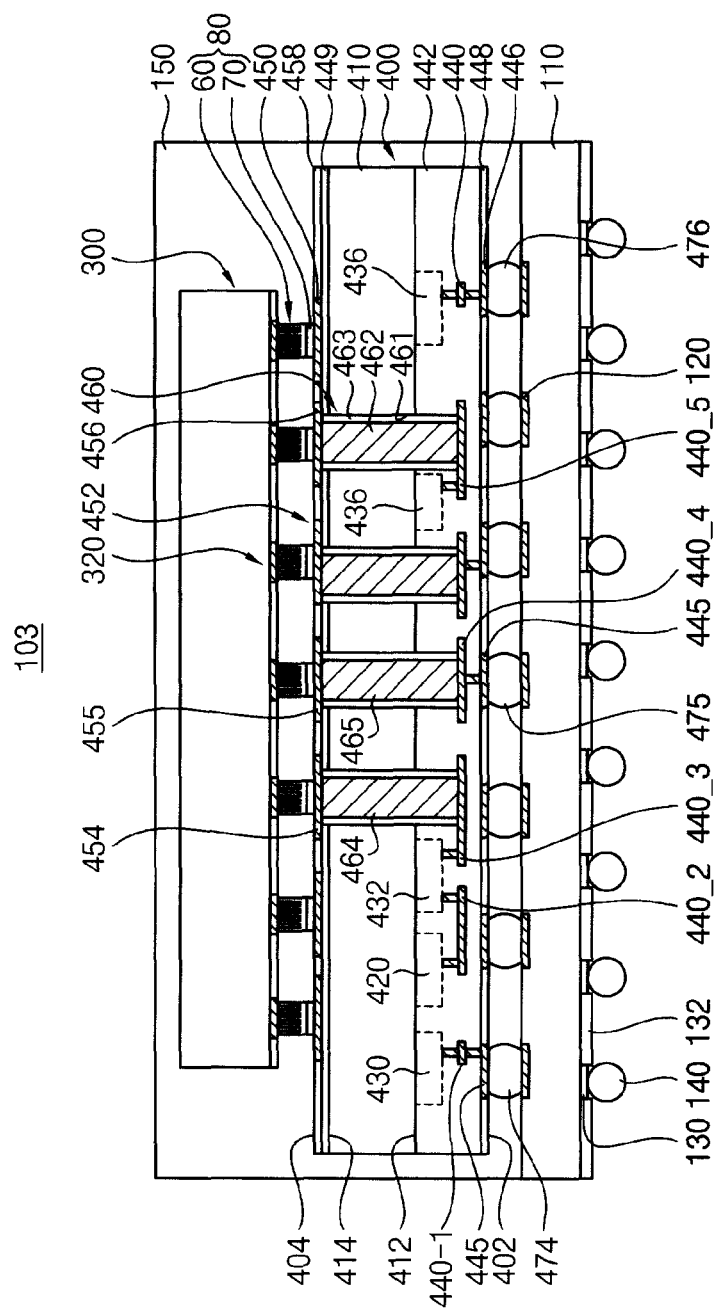
FIG. 39 is a cross-sectional view illustrating a semiconductor package in accordance with a fifth exemplary embodiment.
Figure 40:
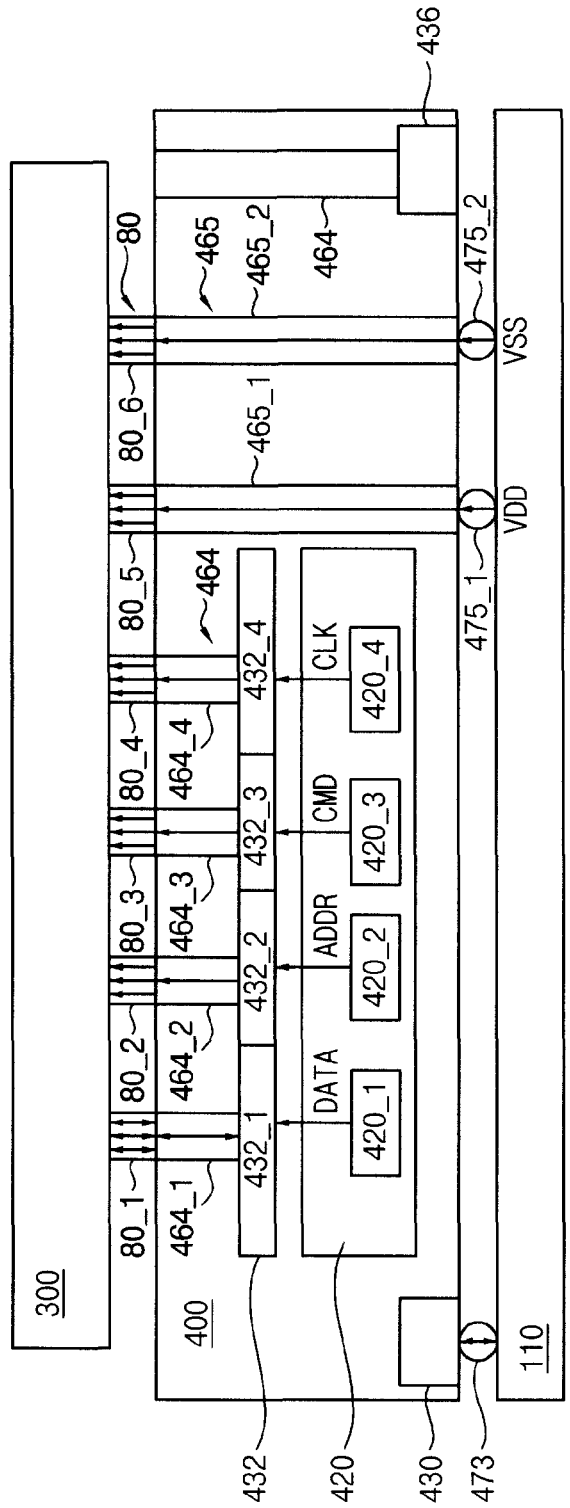
FIG. 40 is a block diagram illustrating paths of signals and power sources in the semiconductor package in FIG. 39.

FIG. 39 is a cross-sectional view illustrating a semiconductor package in accordance with a fifth exemplary embodiment. FIG. 40 is a block diagram illustrating paths of signals and power sources in the semiconductor package in FIG. 39. The present exemplary embodiment is substantially the same as or similar to the exemplary embodiment of FIG. 29 except that the semiconductor package is a system in package (SIP). Thus, the same reference numerals will be used to refer to the same or like elements as those described in the exemplary embodiment of FIG. 29 and any further repetitive explanation concerning the above elements will be omitted.

Referring to FIG. 39, a semiconductor package 103 may include a mounting substrate 110, first and second semiconductor chips 400 and 300 stacked on the mounting substrate 110, a first bump structure connecting the mounting substrate 110 and the first semiconductor chip 400, and a second bump structure 80 connecting the first semiconductor chip 400 and the second semiconductor chip 300.

In the present exemplary embodiment, the semiconductor package 103 may be a system in package (SIP). The first semiconductor chip 400 may be a logic chip including a logic circuit. The second semiconductor chip 300 may be a memory chip including a memory circuit. The memory circuit may include a memory cell region for storing data and/or a memory logic region for operating the memory chip.

The first semiconductor chip 400 may have a first surface 402 and a second surface 404 opposite to the first surface 402. For example, the first surface 402 may be an active surface and the second surface 404 may be a back side.

The first semiconductor chip 400 may include a substrate 410 and a circuit portion formed on the substrate 410. The substrate 410 may have a first face 412 and a second face 414 opposite to the first face 414. The circuit portion may be provided on the first face 412.

The circuit portion may include functional circuits 420, 430, 432, 436 and a first inner wiring 440 and an insulation interlayer 442 covering the first inner wiring 440.

The functional circuits 420, 430, 432, 436 may include integrated circuits. The functional circuits 420, 430, 432, 436 may include transistor or a passive device such as resistance, capacitor, etc. The functional circuits 420, 430, 432, 436 may include a memory control circuit 420, an external input/output circuit 430, a micro input/output circuit 432 and/or an additional functional circuit 436. The memory control circuit 420 may provide a data signal for operating at least one of the second semiconductor chip 300 and a memory control signal. For example, the memory control signal may include address signal, command signal, or clock signal. The external input/output circuit 430 may provide data signal inputted from outside to the memory control circuit 420, or output data signal from the memory control circuit 420 to the first semiconductor chip 400. The micro input/output circuit 432 may receive a data signal or a memory control signal from the memory control circuit 420. The additional functional circuit 436 may perform a function (i.e., operation) other than a memory control or a external input/output function. For example, the additional functional circuit 436 may be a power branch circuit, a RF circuit, an external interface circuit, a control circuit for other component, etc.

The first inner wirings 440 may include at least one wiring pattern and a contact plug vertically connected to the wiring pattern. The first inner wirings 440 may include inner wiring patterns 440_1, 440_2, 440_3, 440_4, 440_5 connected to or insulated from one another. Some of the first inner wirings 440 may be connected to at least one of the functional circuits 420, 430, 432, 436, or may connect between the functional circuits 420, 430, 432, 436.

The first semiconductor chip 400 may include logic chip pads 444, 445, 446 on the first surface 402. At lease one of the logic chip pads 444, 445, 446 may be connected to any one of the first inner wirings 440. An insulation layer pattern 448 may be formed to expose the logic chip pads 444, 445, 446. The insulation layer pattern 448 may protect the circuit portion of the first semiconductor chip 400 from outside.

At least one of the functional circuits 420, 430, 432, 436 may be connected to the first inner wiring 440, or may be connected to at least one of the logic chip pads 444, 445, 446. For example, a first inner wiring pattern 440_1 of the first inner wirings 440 may electrically connect the external input/output circuit 430 to the chip pad 444. A second inner wiring pattern 440_2 may electrically connect the memory control circuit 420 and the micro input/output circuit 432 to each other. A third inner wiring pattern 440_3 may electrically connect the micro input/output circuit 432 to a first through electrode 464. A fourth inner wiring pattern 440_4 may be insulated from other inner wiring pattern and electrically connect a second through electrode 465 to the chip pad 445. A fifth inner wiring pattern 440_5 may be electrically connected to the additional functional circuit 436.

An insulation layer pattern 449 may be provided on the second face 414 of the substrate 410. The insulation layer pattern 449 may include silicon oxide, silicon nitride or silicon oxynitride.

A first wiring pattern 450 may be provided on the insulation layer pattern 449. The first wiring pattern 450 may be a redistribution wiring pattern. The first wiring pattern 450 may be connected to a connection pad 452 on the second surface 404 of the first semiconductor chip 400. An insulation layer pattern 458 may be formed on the second surface 404 of the first semiconductor chip 400 to expose the connection pad 452. The connection pad 452 may include a plurality of connection pads 454, 455, 456 insulated from one another.

The first semiconductor chip 400 may include a through electrode 460 that penetrates the first semiconductor chip 400. An insulation layer 463 may be formed on sidewalls of the via hole 461 that penetrates the substrate 410. The through hole 460 may be provided on the insulation layer 463 to completely fill the via hole 461. An end portion of the through electrode 460 may be directly connected to the first inner wiring 440 and another end portion 460 may be directly connected to the connection pads 454, 455, 456.

The first semiconductor chip 400 may include a plurality of the through electrodes 460. The through electrode 460 may serve as a path for signal or power that is used for operation of the second semiconductor chip 300. The signal may include at least one of a data signal and a control signal. The power may include source voltage (VDD) and ground voltage (VSS). A plurality of the through electrodes 460 may include a first through electrode 464 and a second through electrode 465. The first through electrode 464 may be connected to at least one of the functional circuits 420, 430, 432, 436. For example, an end portion of the first through electrode 464 may be connected to at least one of the functional circuits 420, 430, 432, 436 and another end portion of the first through electrode 464 may be connected to at least one of the connection pads 454, 456. In the present exemplary embodiment, the first through electrode 464 may be connected to the memory control circuit 420 to provide a signal transfer path between the first semiconductor chip 400 and the second semiconductor chip 300. Accordingly, the first through electrode 464 may provide an interface path between the first semiconductor chip 400 and the second semiconductor chip 300. Thus, the at least one of the data signal and the control signal may be unaffected by external signal transfer speed and be transferred from the memory control circuit 420 to the second semiconductor chip 300 through the first through electrode 464. The first through electrode 464 may be connected to at least one of the functional circuits 420, 432, 436 through the second inner wiring pattern 440_2 and the third inner wiring pattern 440_3.

The second through electrode 465 may be insulated from the functional circuits 420, 430, 432, 436. The second through electrode 465 may provide an electrical path that is insulated from the first semiconductor chip 400. The second through electrode 465 may be connected to the fourth inner wiring pattern 440_4 that is insulated from other inner wiring patterns. The second through electrode 465 may provide an electrical signal path between the logic chip pad 445 and the connection pad 455. For example, an end portion of the second through electrode 465 may be connected to the logic chip pad 445 and another end portion of the second through electrode 465 may be connected to the connection pad 455. In the present exemplary embodiment, the second through electrode 465 may be a power transfer path for the second semiconductor chip 300. Accordingly, when a power having a voltage level different from the first semiconductor chip 400 is used for the second semiconductor chip 300, the power may be provided to the second semiconductor chip 300 through the second through electrode 465. Additionally, even if a power having a voltage level identical to the first semiconductor chip 400 is used for the second semiconductor chip 300, the power may be provided to the second semiconductor chip 300 through the second through electrode 465 for reduction of noise. The second through electrode 465 may be connected to the logic chip pad 445 through the fourth inner wiring pattern 440_4. The second through electrode 465 may be formed together with the first through electrode 465 by the same or similar process to have a diameter identical to that of the first through electrode 465. Alternatively, the second through electrode 465 may be formed to have a diameter greater than that of the first through electrode 465, to thereby reduce resistance of a power transfer path and improve power transmission performances.

The first semiconductor chip 400 and the second semiconductor chip 300 may be mounted on the mounting substrate 110. When the first semiconductor chip 400 is a wafer level package, the mounting substrate 110 may be a module board. For example, the first semiconductor chip 400 may be mounted on the mounting substrate 110 by a flip-chip bonding method such that the active surface thereof faces the mounting substrate.

In the present exemplary embodiment, a plurality of first bump structures may be used for electrical connection between the first semiconductor chip 400 and the mounting substrate 110. A plurality of second bump structures 80 may be used for electrical connection between the second semiconductor chip 300 and the first semiconductor chip 400.

The first bump structure may be a solder ball and the second bump structure 80 may be one of the above-mentioned bump structures. In this case, the first bump structure may have a greater size than the second bump structure. Alternatively, the first bump structure may be one of the above-mentioned bump structures.

In the present exemplary embodiment, the first bump structures using a solder ball as a connection member may include a signal connection member 474 electrically connected to the first through electrode 464, a power connection member 475 electrically connected to the second through electrode 465 and an additional connection member 476. Because the functional circuits 430, 436 are formed on the first surface 402 of the first semiconductor chip 400, a signal path from the mounting substrate 110 to the functional circuits 430, 436 may be reduced compared to when the first semiconductor chip 400 is mounted on the mounting substrate 110 such that the second face 404 faces the mounting substrate, to thereby improve transmission performance between the mounting substrate 110 and the functional circuits 430, 436.

The second bump structure 80 may include a first bump 60 and a second bump 70. The first bump 60 may be formed on the connection pad 320 of the second semiconductor chip 300. The second bump 70 may be formed on the first bump 60 and adhered to the connection pad 452 of the first semiconductor chip 400.

Referring to FIGS. 39 and 40, an external signal and power may be provided from the package substrate, that is, the mounting substrate 110 to the first semiconductor chip 400 or the second semiconductor chip 300. The external signal may be provided to the external input/output circuit 430 of the first semiconductor chip 400 through the signal connection member 474 of the first semiconductor chip 400. For example, the external signal may include data to be stored in the memory circuit. The data may be inputted/outputted to/from the memory circuit through the external input/output circuit 430.

A signal for operation of the second semiconductor chip 300 may be generated in the memory control circuit 432 and transferred to the second semiconductor chip 300 through the micro input/output circuit 432, the first through electrode 464 and the second bump structure 80. That is, the first through electrode 464 may be used for an interface between the memory control circuit 420 and the second semiconductor chip 300. The signal for operation of the second semiconductor chip 300 may include a data signal (DATA) and a control signal. The control signal may include an address signal (ADDR), a command signal (CMD) and a clock signal (CLK).

The memory control circuit 420 may include at least one of a data circuit 420_1, an address circuit 420_2, a command circuit 420_3 and a clock circuit 420_4. The data circuit 420_1, the address circuit 420_2, the command circuit 420_3 and the clock circuit 420_4 may generate the data signal (DATA), the address signal (ADDR), the command signal (CMD) and the clock signal (CLK), respectively. The data signal (DATA), the address signal (ADDR), the command signal (CMD) and the clock signal (CLK) may be transferred to a data signal transmission channel 432_1, an address signal transmission channel 432_2, a command signal transmission channel 432_3 and a clock signal transmission channel 432_4 of the micro input/output circuit 432, respectively. Signals (DATA, ADDR, CMD, CLK) may be transferred to the transmission channels 432_1, 432_2, 432_3, 432_4 through some of the first inner wirings 440, respectively. The data signal transmission channel 432_1, the address signal transmission channel 432_2, the command signal transmission channel 432_3 and the clock signal transmission channel 432_4 of the micro input/output circuit 432 may be connected to a data signal through electrode 464_1, an address signal through electrode 464_2, a command signal through electrode 464_3 and a clock signal through electrode 464_4, respectively. The data signal through electrode 464_1, the address signal through electrode 464_2, the command signal through electrode 464_3 and the clock signal through electrode 464_4 may be connected to a data signal bump structure 80_1, an address signal bump structure 80_2, a command signal bump structure 80_3 and a clock signal bump structure 80_4, respectively.

Accordingly, data signal (DATA) may be generated using external data from the external input/output circuit 430 in the data circuit 420_1 and inputted to the second semiconductor chip 300 through the data signal transmission channel 432_1, the data signal through electrode 464_1 and the data signal bump structure 80_1. Additionally, the data signal (DATA) may be outputted from the second semiconductor chip 300 through the data signal bump structure 80_1, the data signal through electrode 464_1, the data signal transmission channel 432_1 and the signal connection member 474.

The address signal (ADDR), the command signal (CMD) and the clock signal (CLK) may be generated in the memory control circuit 420 without an external signal and may be provided to the second semiconductor chip 300. Accordingly, the data circuit 420_1 may include a transmitter and a receiver for two-way communication. The address circuit 420_2, the command circuit 420_3 and the clock circuit 420_4 may include a transmitter.

A power for operation of the second semiconductor chip 300 may be supplied from the mounting substrate 110, and may be transferred to the second semiconductor chip 300 through the power connection member 47, the second through electrode 465 and a power bump structure 80_5, 80_6. Accordingly, the second through electrode 465 may be used to provide power to the second semiconductor chip 300. A plurality of the second through electrodes 465_1, 465_2 may be provided in the first semiconductor chip 400. The power may include source voltage (VDD) and ground voltage (VSS).

For example, the source voltage (VDD) and the ground voltage (VSS) for the second semiconductor chip 400 may be supplied from the mounting substrate 110 to the second semiconductor chip 300 through the source voltage through electrode 465_1 and the ground voltage through electrode 465_2, respectively. The source voltage (VDD) may be supplied to the second semiconductor chip 300 through a source voltage connection member 475_1, the source voltage through electrode 465_1 and the source voltage bump structure 80_5. The ground voltage (VSS) may be supplied to the second semiconductor chip 300 through a ground voltage connection member 475_2, the ground voltage through electrode 465_2 and the ground voltage bump structure 80_6.

Alternatively, when a power having different voltage levels is used for operation of the second semiconductor chip 300, the power having different voltage levels may be supplied separately to the mounting substrate 110, or a power having one voltage level may be supplied to the first semiconductor chip 400 or the second semiconductor chip 300 and then may branch off to different voltage levels therein. For example, when a power having different voltage levels is supplied separately, the power having different voltage levels may be supplied to the second semiconductor chip 300 through a plurality of the second through electrodes 465_1, 465_2 according to a respective voltage level, respectively. On the other hand, when a power branches off in the power branch circuit 436, the power having a voltage level used for operation of the second semiconductor chip 300 may be supplied to the second semiconductor chip 300 through the first through electrode 464 connected to the power branch circuit 436.

In the present exemplary embodiment, a signal path and a power path to the second semiconductor chip 300 may be independent of each other. A signal may be transferred from the memory control circuit 420 of the first semiconductor chip 400 to the second semiconductor chip 300 through the first through electrode 464 and a power may be transferred to the second semiconductor chip 300 through the second through electrode 465 that is independent of the signal path.

Sixth Exemplary Embodiment

Figure 41:
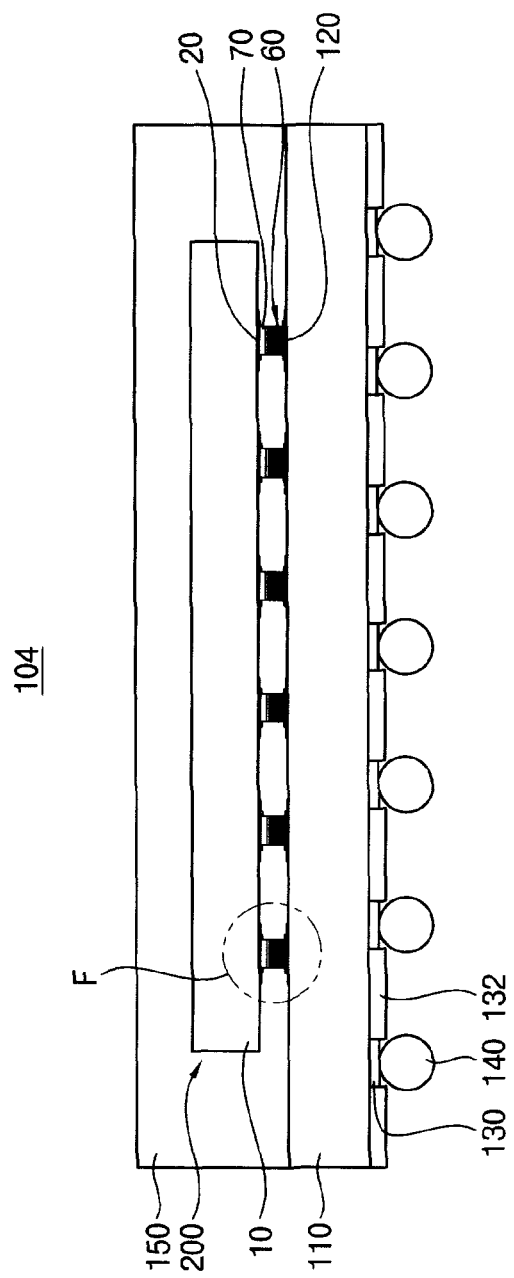
FIG. 41 is a cross-sectional view illustrating a semiconductor package in accordance with a sixth exemplary embodiment.
Figure 42:
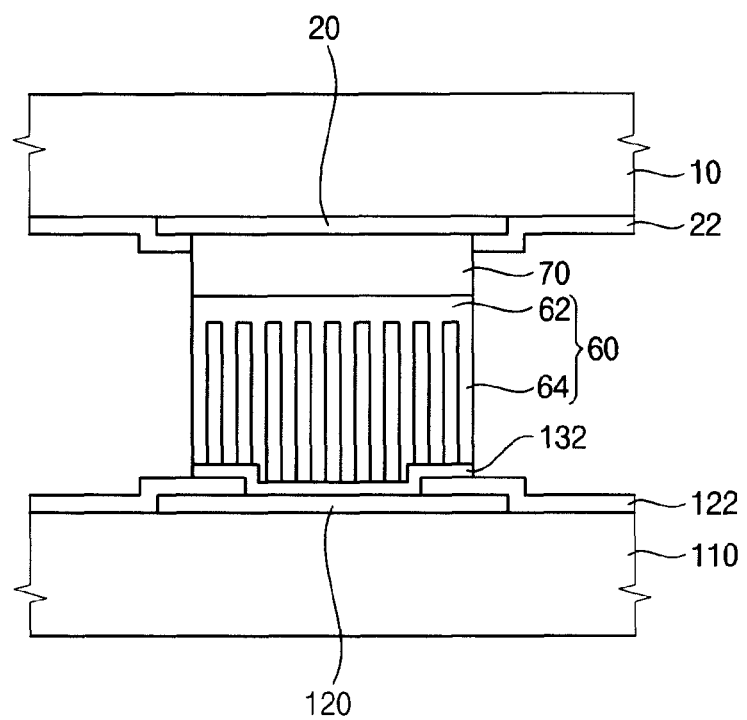
FIG. 42 is a cross-sectional view illustrating the bump structures in FIG. 41.

FIG. 41 is a cross-sectional view illustrating a semiconductor package in accordance with a sixth exemplary embodiment. FIG. 42 is a cross-sectional view illustrating the bump structures in FIG. 41. FIG. 42 is an enlarged cross-sectional view illustrating "F" portion in FIG. 41. The present exemplary embodiment is substantially the same as or similar to the exemplary embodiment of FIG. 1 except for an arrangement of a bump structure. Thus, the same reference numerals will be used to refer to the same or like elements as those described in the exemplary embodiment of FIG. 1 and any further repetitive explanation concerning the above elements will be omitted.

Referring to FIGS. 41 and 42, a semiconductor package 104 may include a bump structure for electrical connection between a mounting substrate 110 and a semiconductor chip 200. The bump structure may include a first bump 60 and a second bump 70.

In the present exemplary embodiment, a seed layer pattern 132 may be formed on a connection pad 120 of the mounting substrate 110. Nano-wires 64 of the first bump 60 may extend from the seed layer pattern 132 on the connection pad 120 in a vertical direction to the mounting substrate 110. In this case, the first bump 60 may be formed on the connection pad 120 of the mounting substrate 110, and the second bump 70 may be arranged on the first bump 60 and adhered to a connection pad 20 of the semiconductor chip 200.

Hereinafter, a method of manufacturing a semiconductor package will be explained.

Referring to FIG. 42, a seed layer (not illustrated) may be formed on the connection pad 120 of the mounting substrate 110. The seed layer may not be formed on a substrate 10 of the semiconductor chip. The seed layer may be formed on the connection pad 120 that is exposed by an insulation layer pattern 122.

Then, processes similar to those illustrated in FIGS. 5 to 11 may be performed to form a first bump 60 on the connection pad 120 of the mounting substrate 110 and a second bump 70 on the first bump 60. The second bump 70 may be adhered to the connection pad 20 of the semiconductor chip by a reflow process to mount the semiconductor chip 200 on the mounting substrate 110.

Seventh Exemplary Embodiment

Figure 43:
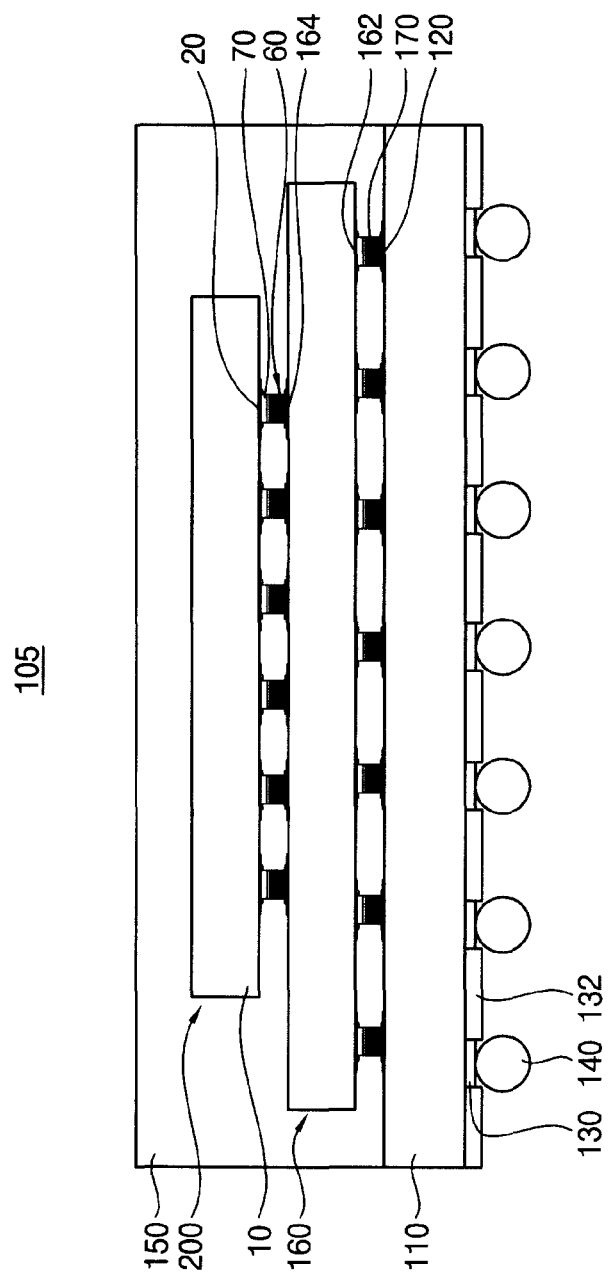
FIG. 43 is a cross-sectional view illustrating a semiconductor package in accordance with a seventh exemplary embodiment.

FIG. 43 is a cross-sectional view illustrating a semiconductor package in accordance with a seventh exemplary embodiment. The present exemplary embodiment is substantially the same as the exemplary embodiment of FIG. 1 except for a redistribution plate. Thus, the same reference numerals will be used to refer to the same or like elements as those described in the exemplary embodiment of FIG. 1 and any further repetitive explanation concerning the above elements will be omitted.

Referring to FIG. 43, a semiconductor package 105 may further include a redistribution plate 160 between a mounting substrate 110 and a semiconductor chip 200.

In a seventh exemplary embodiment, the redistribution plate 160 may be an interposer having fine wirings with high density.

A plurality of first bump structures may be used for electrical connection between the semiconductor chip 200 and the redistribution plate 160. The first bump structure may be any one of the above-mentioned bump structures.

In the present exemplary embodiment, the first bump structure may include a first bump 60 and a second bump 70. The first bump 60 may include a plurality of nano-wires. The first bump 60 may be arranged on a connection pad 164 of the redistribution plate 160, and the second bump 70 may be formed on the first bump 60 and adhered to the connection pad 20 of the semiconductor chip 200.

A plurality of second bump structures 170 may be used for electrical connection between the redistribution plate 160 and the mounting substrate 110. The second bump structure may be any one of the above-mentioned bump structures.

In the present exemplary embodiment, a first bump of the second bump structure 170 may be arranged on a connection pad 120 of the mounting substrate 110, and a second bump of the second bump structure 170 may be formed on the first bump and adhered to a connection pad 162 of the redistribution plate 162.

Alternatively, the second bump structure may be a solder ball. In this case, the second bump structure may have a greater size than the first bump structure.

Eighth Exemplary Embodiment

Figure 44:
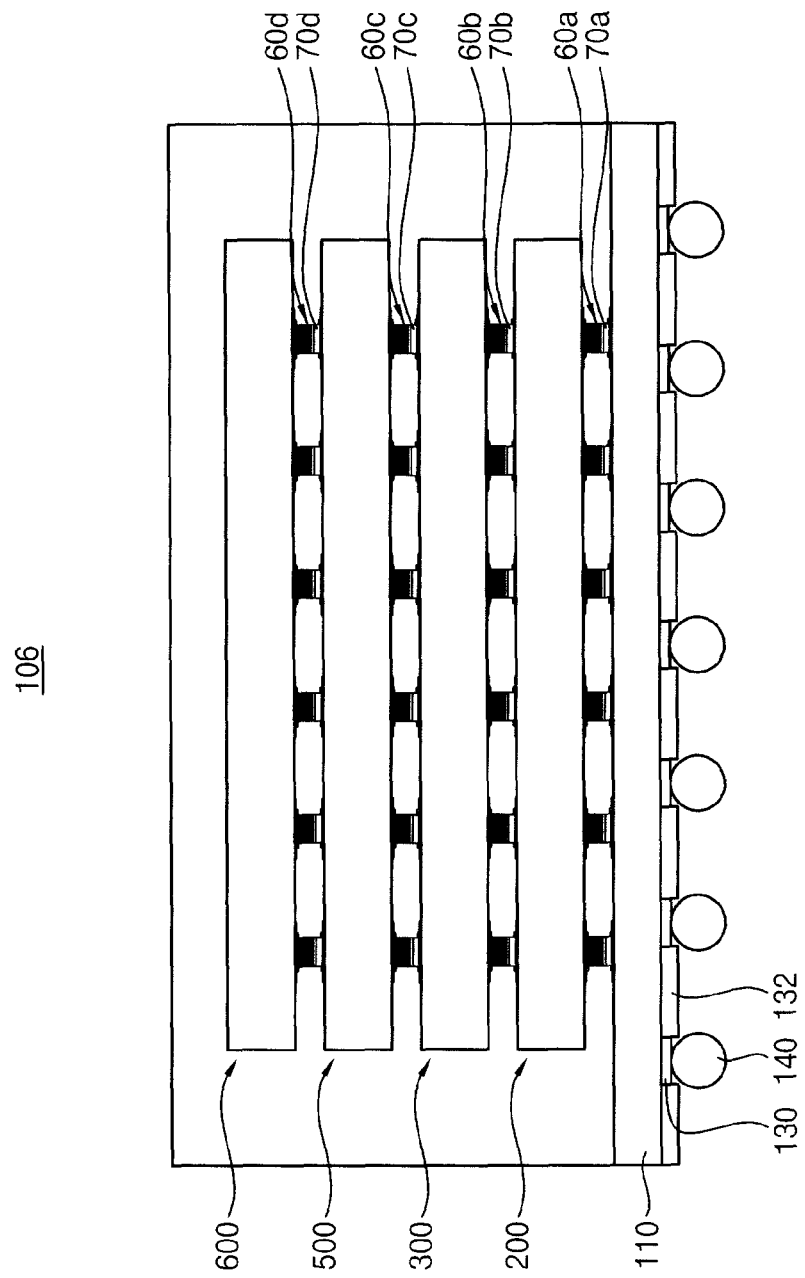
FIG. 44 is a cross-sectional view illustrating a semiconductor package in accordance with an eighth exemplary embodiment.

FIG. 44 is a cross-sectional view illustrating a semiconductor package in accordance with an eighth exemplary embodiment. The present exemplary embodiment is substantially the same as or similar to the exemplary embodiment of FIG. 1 except for the number of stacked semiconductor chips. Thus, the same reference numerals will be used to refer to the same or like elements as those described in the exemplary embodiment of FIG. 1 and any further repetitive explanation concerning the above elements will be omitted.

Referring to FIG. 44, a semiconductor package 106 may include a mounting substrate 110, first, second, third and fourth semiconductor chips 200, 300, 500, 600, and first, second, third and fourth bump structures connecting the mounting substrate 110 and the semiconductor chips.

In the present exemplary embodiment, the first semiconductor chip 200 may be mounted on and electrically connected to the mounting substrate 110 via a plurality of the first bump structures. The second semiconductor chip 300 may be stacked on and electrically connected to the first semiconductor chip 200 via a plurality of the second bump structures. The third semiconductor chip 500 may be stacked on and electrically connected to the second semiconductor chip 300 via a plurality of the third bump structures. The fourth semiconductor chip 600 may be stacked on and electrically connected to the third semiconductor chip 500 via a plurality of the fourth bump structure.

In the present exemplary embodiment, the first bump structure may include a first bump 60a and a second bump 70a. The first bump 60a may be arranged on a connection pad of the first semiconductor chip 200, and the second bump 70a may be formed on the first bump 60a and adhered to a connection pad of the mounting substrate 110.

The second bump structure may include a first bump 60b and a second bump 70b. The first bump 60b may be arranged on a connection pad of the second semiconductor chip 300, and the second bump 70b may be formed on the first bump 60b and adhered to a connection pad of the first semiconductor chip 200.

The third bump structure may include a first bump 60c and a second bump 70c. The first bump 60c may be arranged on a connection pad of the third semiconductor chip 500, and the second bump 70c may be formed on the first bump 60c and adhered to a connection pad of the second semiconductor chip 300.

The fourth bump structure may include a first bump 60d and a second bump 70d. The first bump 60d may be arranged on a connection pad of the fourth semiconductor chip 600, and the second bump 70d may be formed on the first bump 60d and adhered to a connection pad of the third semiconductor chip 500.

It is understood that additional semiconductor chips may be stacked on the fourth semiconductor chip 600 via a plurality of bump structures and the number of the semiconductor chips is not limited to those described and illustrated in above-described exemplary embodiment.

Figure 45:
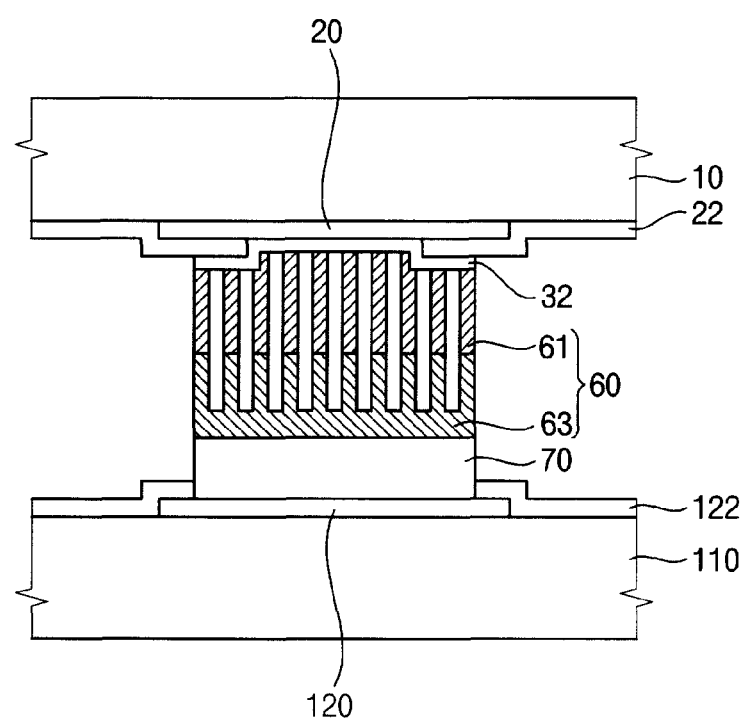
FIG. 45 is another modified example of the bump structure in FIG. 2.

FIG. 45 is another modified example of the bump structure in FIG. 2. FIG. 45 is an enlarged cross-sectional view illustrating "A" portion in FIG. 1.

Referring to FIG. 45, the first bump 60 may have a multi-layer structure having at least two materials. The first bump 60 may include at least one of copper (Cu), nickel (Ni), gold (Au), silver (Ag), indium (In), etc.

For example, a lower portion of the first bump 60 may include copper (Cu) and an upper portion of the first bump 70 may include nickel (Ni). The nano-wire 46 of the first bump 60 may include copper (Cu) and nickel (Ni) and the body 63 may include nickel (Ni).

Figure 46:
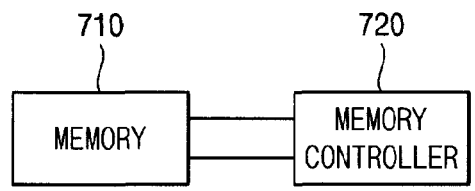
FIG. 46 illustrates a memory according to an exemplary embodiment.

FIG. 46 illustrates a memory 710 according to an exemplary embodiment.

As illustrated in FIG. 46, the present exemplary embodiment includes a memory 710 connected to a memory controller 720. The memory 710 may include the memory device discussed above. The memory controller 720 supplies input signals for controlling operation of the memory.

Figure 47:
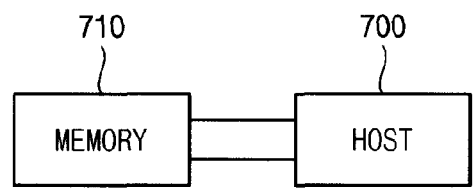
FIG. 47 illustrates a memory according to another exemplary embodiment.

FIG. 47 illustrates a memory 710 according to another exemplary embodiment.

Referring to FIG. 47, the present exemplary embodiment includes a memory 710 connected to a host system 700. The memory 710 may include the memory device discussed above.

The host system 700 may include an electric device such as a personal computer, a digital camera, a mobile device, a gaming machine, communication equipment, etc. The host system 700 supplies the input signals from a controlling operation of the memory 710. The memory 710 is used as a data storage medium.

Figure 48:
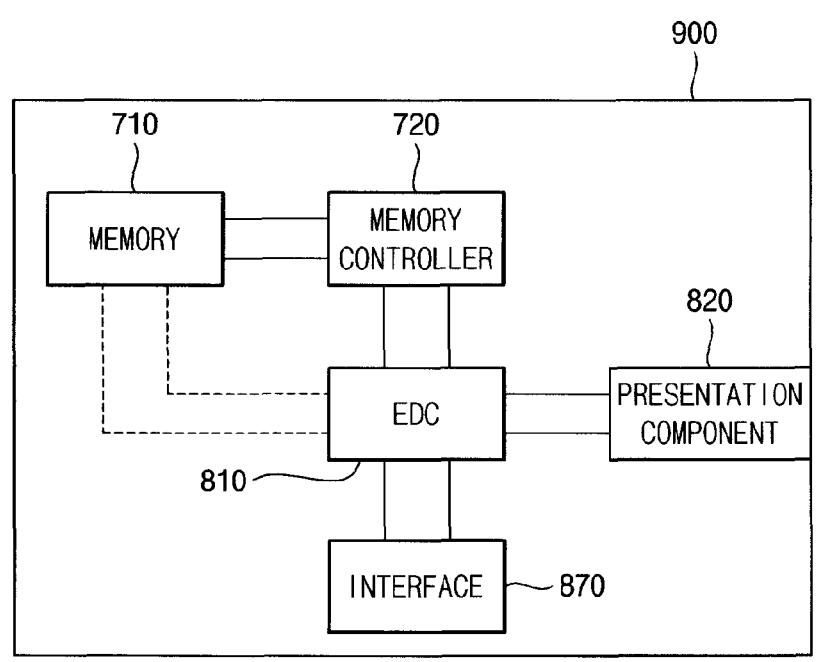
FIG. 48 illustrates a portable device according to an exemplary embodiment.

FIG. 48 illustrates a portable device 900 according to an exemplary embodiment. The portable device 900 may be an audio (e.g., MP3) player, a video player, a combination video and audio player, etc. As illustrated, the portable device 900 may include the memory 710 and memory controller 720. The memory may include the memory device discussed above. The portable device 900 may also include an encoder/decoder EDC 810, a presentation component 820 and an interface 870. Data (video, audio, etc.) is inputted/outputted to/from the memory 710 via the memory controller 720 by the EDC 810.

As described above, a bump structure in accordance with exemplary embodiments may include a first bump having a plurality of nano-wires and a second bump on the first bump. The bump structure may be used for electrical connection between semiconductor devices having connection pads with fine pitches under micrometer-scale.

Accordingly, the nano-wires may mechanically support the semiconductor device and increase surface areas of electrical signal paths to provide a low resistance for high frequency signals, to thereby improve mechanical and electrical reliability.

Further, since a plurality of the nano-wires is formed on one connection pad, yield rates of the semiconductor packages may be increased and shear stresses exerted on the semiconductor chip during a chip bonding process may be reduced to thereby improve process reliability.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present inventive concept. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor package, the method comprising:
    providing a first bump on a connection pad of a first substrate, the first bump including a plurality of nano-wires and a body connecting and provided integrally with end portions of the plurality of nano-wires;
    providing a second bump on the body of the first bump; and
    adhering the second bump to a connection pad of a second substrate.

2. The method of claim 1, wherein the providing the first bump comprises:
    providing a template having nano-sized openings on the connection pad of the first substrate; and
    filling up the nano-sized openings of the template with a conductive material to form the first bump.

3. The method of claim 2, wherein the providing the template comprises:
    providing an aluminum layer on the connection pad; and
    anodizing the aluminum layer to form the template having the nano-sized openings with a regular arrangement.

4. The method of claim 2, wherein the providing the template comprises:
   providing a polymer layer on the connection pad; and
   patterning the polymer layer to form the template having the nano-sized openings.

5. A method of manufacturing a semiconductor package, the method comprising:
   providing a first bump on a connection pad of a first substrate, the first bump including a plurality of nano-wires and a body connecting end portions of the plurality of nano-wires;
   providing a second bump on the body of the first bump; and
   adhering the second bump to a connection pad of a second substrate,
   wherein the providing the first bump comprises:
      providing a template having nano-sized openings on the connection pad of the first substrate; and
      filling up the nano-sized openings of the template with a conductive material to form the first bump,
   wherein the providing the template comprises:
      providing a polymer layer on the connection pad; and
      patterning the polymer layer to form the template having the nano-sized openings, and
   wherein the patterning the polymer layer comprises partially removing the polymer layer by light to form the nano-sized openings in the polymer layer.

6. The method of claim 2, wherein the filling up the openings of the template is performed by an electroplating process.

7. The method of claim 6, wherein the electroplating process is performed such that a conductive material is overplated to form the first bump including the plurality of nano-wires formed in the openings and the body formed on the template.

8. The method of claim 2, further comprising removing the template after forming the second bump.

9. The method of claim 1, wherein the first substrate is a substrate of a semiconductor chip and the second substrate is a mounting substrate.

10. The method of claim 1, wherein the first bump is arranged on a plug that penetrates the first substrate.

11. The method of claim 10, further comprising stacking at least one semiconductor device on the first substrate, wherein the at least one semiconductor device is electrically connected to the first substrate.

12. The method of claim 10, further comprising disposing a redistribution plate between the first substrate and the second substrate, wherein the redistribution plate is electrically connected to at least one of the first substrate and the second substrate by the first bump and the second bump.

13. A method of manufacturing a bump structure for a semiconductor package, the method comprising:
   providing a first bump for connection to a connection pad of a first substrate, the first bump including a plurality of nano-wires and a body connecting and provided integrally with end portions of the plurality of nano-wires; and
   providing a second bump on the body of the first bump to be adhered to a connection pad of a second substrate.

* * * * *